(12) United States Patent
Kurokawa et al.

(10) Patent No.: US 7,701,214 B2
(45) Date of Patent: Apr. 20, 2010

(54) MAGNETIC RESONANCE IMAGING APPARATUS

(75) Inventors: Shinji Kurokawa, Kokubunji (JP); Yo Taniguchi, Kokubunji (JP); Hisaaki Ochi, Kodaira (JP); Shin-ichiro Umemura, Sendai (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 11/912,763

(22) PCT Filed: Feb. 23, 2006

(86) PCT No.: PCT/JP2006/303247

§ 371 (c)(1),
(2), (4) Date: Dec. 8, 2008

(87) PCT Pub. No.: WO2006/117922

PCT Pub. Date: Nov. 9, 2006

(65) Prior Publication Data

US 2009/0219020 A1 Sep. 3, 2009

(30) Foreign Application Priority Data

Apr. 28, 2005 (JP) ............................. 2005-131705
Sep. 27, 2005 (JP) ............................. 2005-279352

(51) Int. Cl.
*G01V 3/00* (2006.01)

(52) U.S. Cl. ...................................................... 324/318

(58) Field of Classification Search ......... 324/300–335; 600/407–445
See application file for complete search history.

(56) References Cited

U.S. PATENT DOCUMENTS 6,476,607 B1 * 11/2002 Dannels et al. ............. 324/309
6,794,869 B2   9/2004 Brittain (Continued)

FOREIGN PATENT DOCUMENTS

JP         2000-229073        8/2000

(Continued)

OTHER PUBLICATIONS

David G. Kruger, et al., "Continuously Table Data Acquisition Method for Long FOV Contrast-Enhanced MRA and Whole-Body MRI". Med. 2002:47:224-231.

(Continued)

*Primary Examiner*—Brij B Shrivastav
(74) *Attorney, Agent, or Firm*—Antonelli, Terry, Stout & Kraus, LLP.

(57) ABSTRACT

When a magnetic resonance signal is received more than once, while a table (transfer unit) is moved, a gradient magnetic field is applied in the table moving direction, and an application amount (intensity and application time) of the gradient magnetic field in the table moving direction is changed every acquisition of data. As for the encoding by the gradient magnetic field in the table moving direction, a series of phase encode is performed at different positions of an examination target, unlike a conventional phase encode. Therefore, the Fourier transform cannot be applied to the image reconstruction. Given this situation, a magnetization map of total FOV of the examination target is determined in such a manner that a sum of the square of an absolute value of a difference is minimized, the difference between a received signal and a signal calculated from the magnetization map set as a variable, and then, the reconstruction is performed. Even when a size of signal acquisition area in the table moving direction is narrow, the magnetic resonance imaging apparatus of the present invention is capable of taking an image of a wide field of view at high speed, by performing the imaging while the table is moved continuously.

13 Claims, 26 Drawing Sheets

U.S. PATENT DOCUMENTS

| | | | |
|---|---|---|---|
| 7,202,666 B2 * | 4/2007 | Wang et al. | 324/309 |
| 7,417,430 B2 * | 8/2008 | Aldefeld et al. | 324/309 |
| 7,436,178 B2 * | 10/2008 | Keupp et al. | 324/318 |
| 2007/0156042 A1 * | 7/2007 | Unal | 600/410 |
| 2007/0208248 A1 * | 9/2007 | Harvey et al. | 600/410 |
| 2007/0222442 A1 * | 9/2007 | Aldefeld et al. | 324/300 |
| 2009/0001984 A1 * | 1/2009 | Hwang | 324/307 |
| 2009/0012385 A1 * | 1/2009 | Takizawa et al. | 600/410 |
| 2009/0278535 A1 * | 11/2009 | Takizawa et al. | 324/309 |

FOREIGN PATENT DOCUMENTS

| | | |
|---|---|---|
| JP | 2002-248089 | 9/2002 |
| JP | 2003-135429 | 5/2003 |
| JP | 2004-097826 | 4/2004 |

OTHER PUBLICATIONS

Thomas K. F. Foo, et al., "High-Spatial-Resolution Multistation MR Imaging of Lower-Extremity Peripheral Vasculature with Segmented Volume Acquisition: Feasibility Study[1]", Radiology. 2001:219:835-841.

E. Mark Haacke, et al., "Frequency Encoding and the Fourier Transform", Magnetic Resonance Imaging, Chapter 9, pp. 142-143.

* cited by examiner

FIG.1
(a)
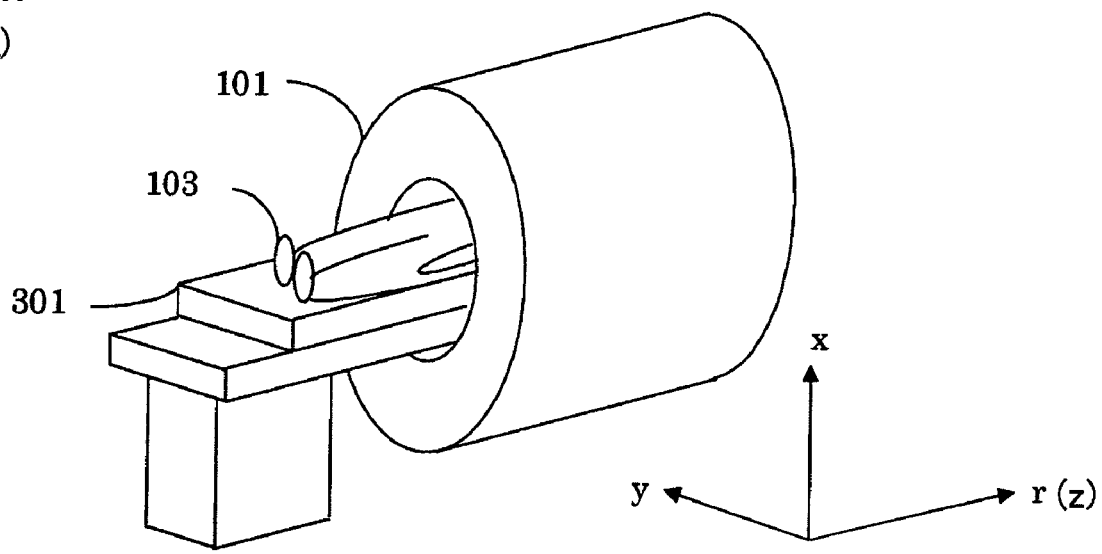
(b)
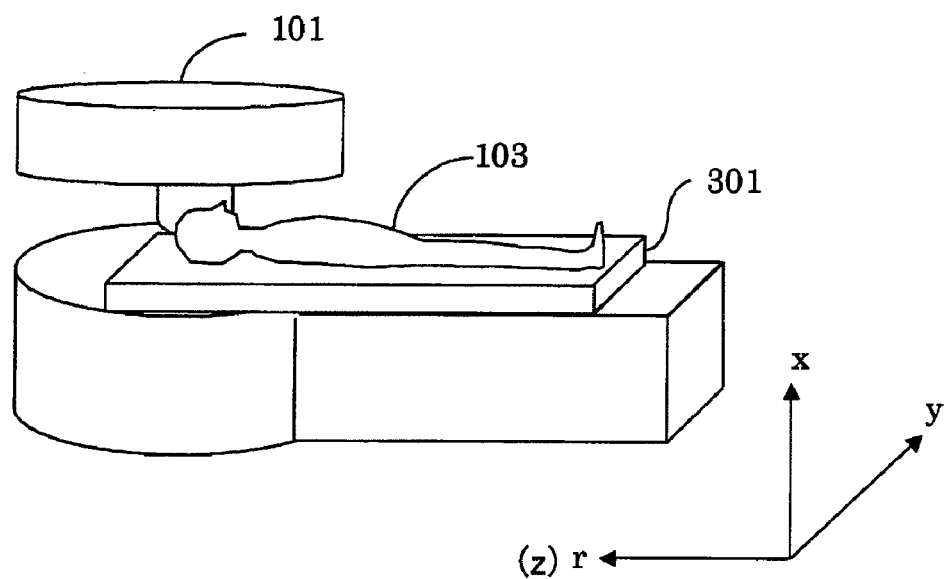

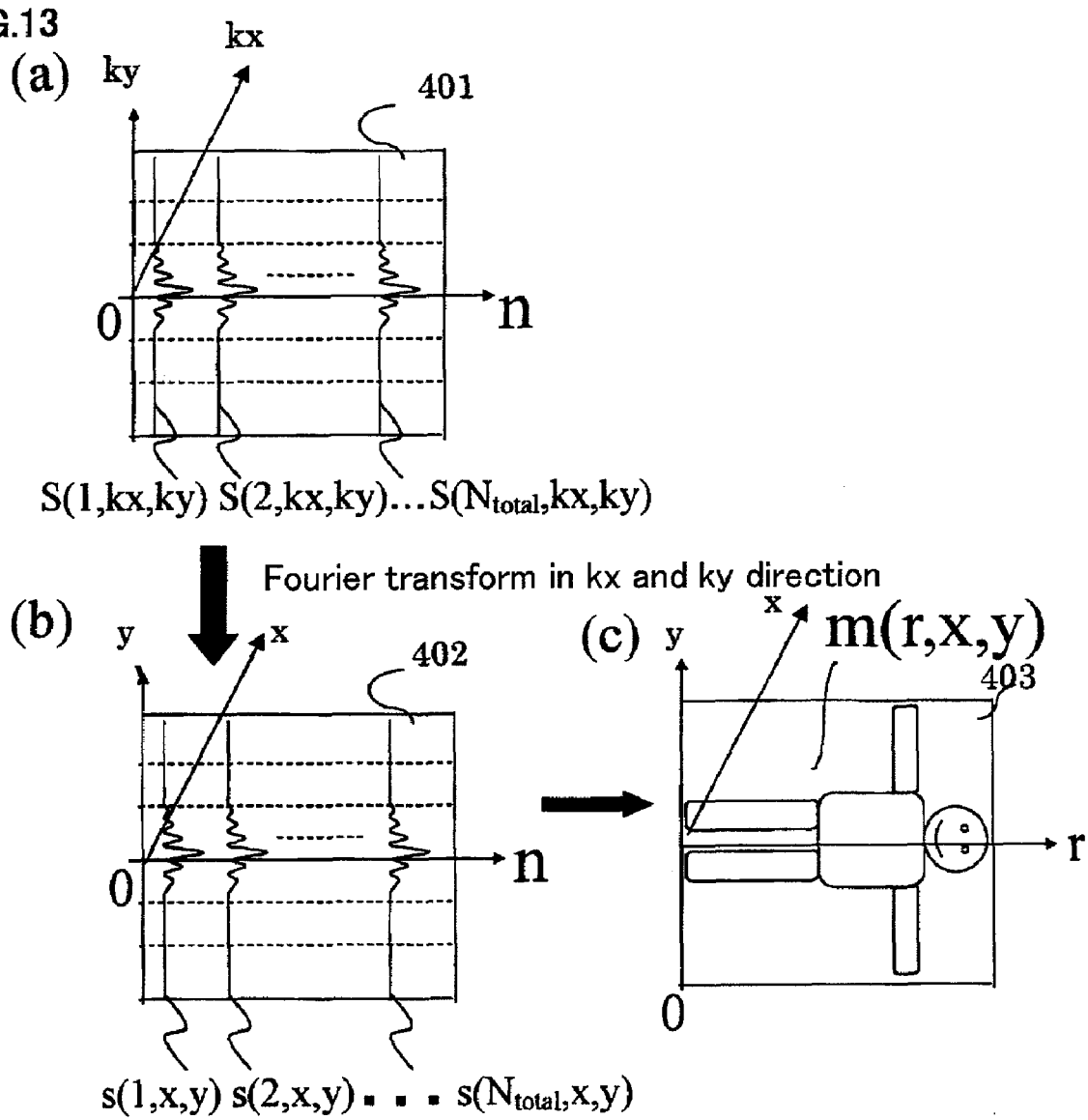

FIG.16
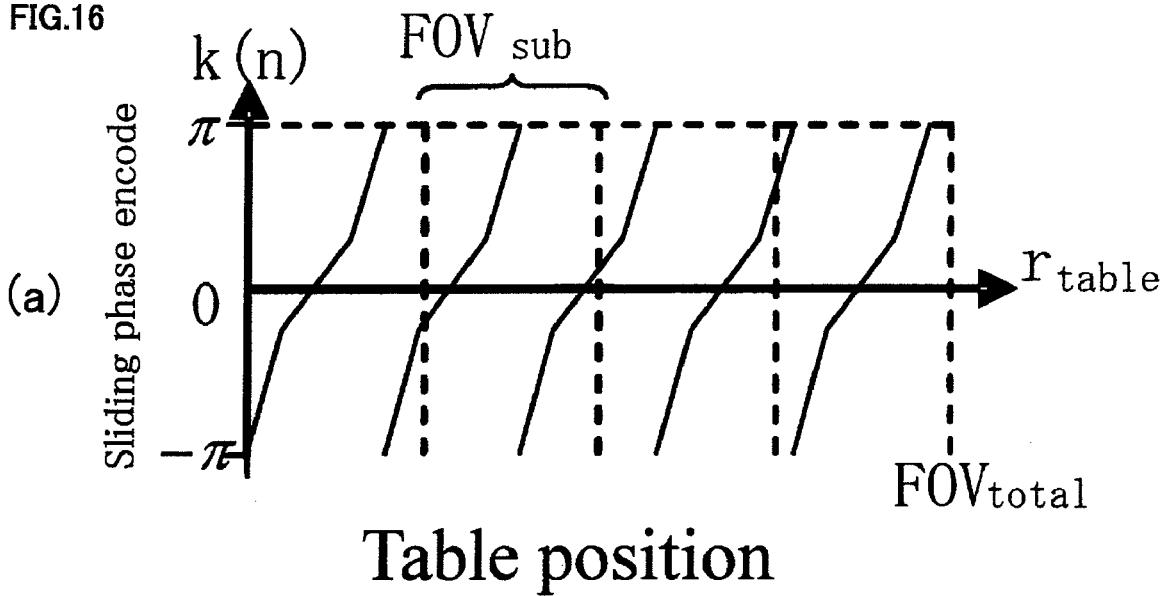
(a)
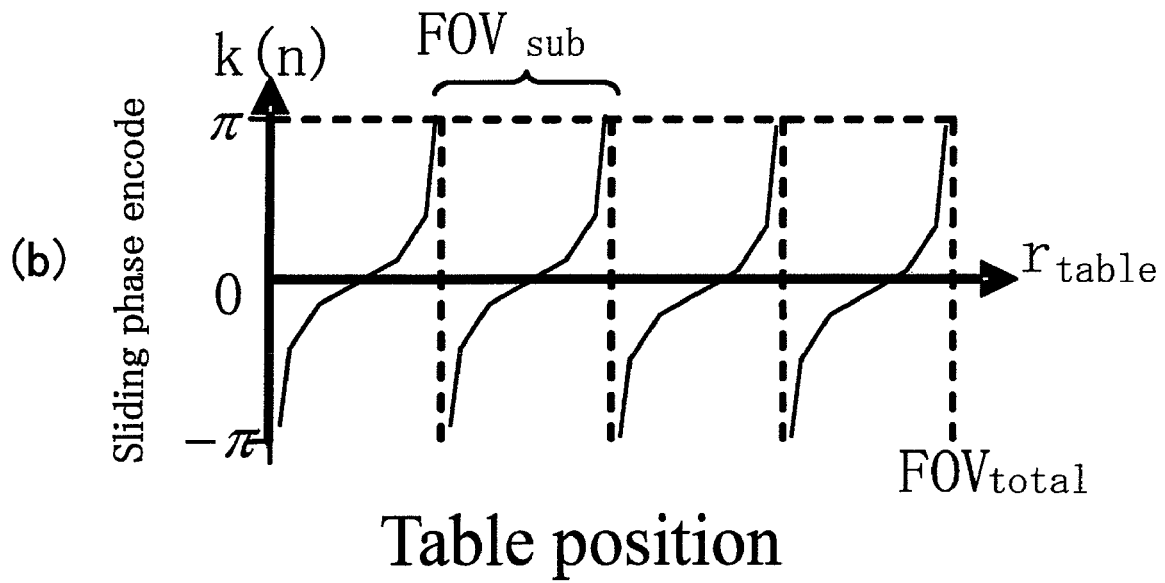
(b)

MAGNETIC RESONANCE IMAGING APPARATUS

TECHNICAL FIELD

The present invention relates to an inspection apparatus using a nuclear magnetic resonance (MRI: Magnetic Resonance Imaging). In particular, it relates to a technique that uses a moving table to take an image of a field of view, wider than an area available for imaging which is limited to an area within the apparatus. It further relates to a method to obtain device characteristics data that is required for reconstructing an image in the aforementioned imaging technique.

BACKGROUND ART

The MRI apparatus is a medically used diagnostic imaging apparatus that produces a nuclear magnetic resonance in a hydrogen nucleus contained in a tissue of an examination target that is placed within a static magnetic field, and obtains a tomographic image of the examination target, according to the nuclear magnetic resonance signal being generated. In the MRI apparatus, since an area available for obtaining the signal is limited in the static magnetic field, conventionally, only a relatively narrow area has been allowed to be subjected to the imaging. However, in recent years, a total body imaging technique using a moving table has been established, and a new system of total body screening using the MRI is now being broadened.

There are two main types in the total body imaging, a multi-station imaging method (non-patent document 1), and a continuously moving table imaging method (patent document 1 and non-patent document 2). Both methods above are to take an image of a wider area (referred to as "total FOV") in an area available for imaging (referred to as "sub FOV") that is limited area in the MRI apparatus. The multi-station imaging method is to take an image by dividing the FOV for total body into sub FOV parts, and create a total image by piecing those sub FOV parts together. Since the imaging of each sub FOV is performed by a method that is the same as a general imaging method, there is an advantage that a conventional imaging technique can be easily applied. However, there are also disadvantages as the following: An image may be distorted on a joint, due to inhomogeneity of the static magnetic field and non-linearity of a gradient magnetic field, rendering the joint non-smooth; and since the imaging cannot be performed while the table is moving, the imaging time may be extended in proportion to the time period when the table is moving. If the field of view in the table moving direction is narrow, this may increase the number of times when the imaging is interrupted to move the table, thereby further extending the imaging time and causing a problem.

On the other hand, the moving table imaging method is a method to obtain a signal while the table is moving. In the moving table imaging method that takes an image which is parallel to the table moving direction, the read-out direction should be set to be the same as the table moving direction. However, there is an advantage that a seamless image can be obtained within a short period of time.

Patent document 1: Japanese Published Unexamined Patent Application No. 2003-135429

Non-patent document 1: Thomas K. F. Foo, Vincent B. Ho, Maureen N. Hood, Hani B. Marcos, Sandra L. Hess, and Peter L. Choyke, Radiology. 2001:219:835-841

Non-patent document 2: David G. Kruger, Stephen J. Riederer, Roger C. Grimmk, and Phillip J. Rossman, Magn. Reson. Med. 2002:47:224-231

DISCLOSURE OF THE INVENTION

Problem to be solved by the Invention

As mentioned above, in the moving table imaging method, a seamless image can be obtained within a short period of time. However, since there is a limitation that the read-out direction has to be the same as the table moving direction, there is a problem that the imaging time may be increased if the sub FOV is narrowed in the moving direction. In other words, when the sub FOV is narrowed in the table moving direction, the sample number in a frequency encode direction (read-out direction) has to be reduced in order to obtain an image having the same resolution, and there is no change in the phase encode number. In general, the imaging time is approximately proportional to the phase encode number, and it is hardly affected by the sample number in the frequency encode direction. Therefore, it takes the same time for obtaining data of one sub FOV irrespective of whether the sub FOV is narrow or wide in the table moving direction. Accordingly, if the sub FOV is narrow in the table moving direction, it takes a longer time for taking an image of the field of view being expanded.

In order to solve this problem, it is conceivable that the phase encode is performed in the table moving direction. However, in the conventional idea of using the Fourier transform for image reconstruction, it has been difficult to perform the phase encode in the table moving direction. The reason is as the following. In the moving table imaging method, a region being excited varies in the table moving direction. In a read-out process, the entire encoding is completed within the time of measuring one signal, i.e., within a time period that allows a variation of the excited region to be ignored. However, in the case of the phase encode, a different encode is given every measurement of one signal, the excited region may vary to a large extent by the time when the entire encoding is completed. The image reconstruction using the Fourier transform is established on the premise that a target image region is subjected to a series of encoding, and therefore the situation above is not applicable here.

Considering the situation above, an object of the present invention is to provide an MRI apparatus that is capable of taking an image of total FOV within a short period of time, even in the case where the sub FOV is narrow in the table moving direction.

Means to Solve the Problem

The MRI apparatus according to the present invention applies a gradient magnetic field in the table moving direction, while a table (transfer unit) is moved, receives a magnetic resonance signal more than once, and varies an application amount (intensity and application time) of the gradient magnetic field in the table moving direction every acquisition of data. This encoding according to the gradient magnetic field in the table moving direction is a new encoding in which a series of encoding is performed at different locations of the examination target (referred to as "sliding phase encode"). A magnetization map of the total FOV on the examination target is determined in such a manner that the sum of the square of an absolute value of a difference is minimized, the difference between a received signal and a signal calculated from the magnetization map set as a variable, whereby a reconstruction is performed.

In order to calculate a signal according to the magnetization map being set as a variable, i.e., a presumptive magnetization map, device characteristics data is utilized, such as gradient magnetic field non-linearity, static magnetic field inhomogeneity, an excitation map of transmission coil, and a sensitivity map of receiving coil. The MRI apparatus according to the present invention measures a nuclear magnetic resonance signal to obtain this device characteristics (referred to as "device characteristics measurement"), and reconstructs an image by using the device characteristics data calculated from the nuclear magnetic resonance signal being measured. The measurement of the device characteristics data may be performed independently from the substantial measurement of the nuclear magnetic resonance signal for obtaining the magnetization map of the examination target (referred to as "main scan"), or it may be performed simultaneously with the main scan. In the former case, the device characteristics measurement is performed by the multi-station imaging method, for instance. In other words, the transfer unit is moved to each multiple station, and the device characteristics measurement is executed at each station of the transfer unit. In the latter case, a part of the nuclear magnetic resonance signal being measured in the main scan may be shared as a signal to obtain the device characteristics data. It is preferable that the part of the nuclear magnetic resonance signal being shared is data in a low frequency region.

The MRI apparatus according to the present invention may be applied to any type, a vertical magnetic field type apparatus or a horizontal magnetic field type apparatus. In addition, since the sliding phase encode is able to be performed independently of the frequency encode and the phase encode, it is possible to be applied to any of the imaging, 2D imaging, 3D imaging, or multislice imaging.

EFFECT OF THE INVENTION

According to the present invention, the sliding phase encode is performed in the table moving direction, and if the sub FOV in the table moving direction is reduced, the sliding phase encode for the sub FOV can be decreased in response to this reduction. Therefore, the time required for encoding a unit distance in the table moving direction may become approximately constant, and a high-speed imaging is possible without being affected by the length of the sub FOV in the table moving direction.

BEST MODE FOR CARRYING OUT THE INVENTION

Hereinafter, referring to the accompanying drawings, an embodiment of the present invention will be explained. A configuration of the MRI apparatus to which the present invention is applied will be explained. FIG. 1(a) and FIG. 1(b) respectively illustrate overviews of a horizontal magnetic field type MRI apparatus and a vertical magnetic field type MRI apparatus, and the present invention can be applied to any types of MRI apparatus. In the horizontal magnetic field type MRI apparatus, a static magnetic field magnet 101 such as a solenoid type that produces a horizontal static magnetic field is employed, a test object 103 is transferred into a bore of the magnet in a state being laid on the table 301, and imaging is performed. On the other hand, in the vertical magnetic field type MRI apparatus, a pair of static magnetic field magnets 101 is placed on the upper and lower sides of the space where the test object 103 is placed, and the test object 103 is transferred into the static magnetic field in the state being laid on the table 301. It is to be noted that in the figures, the arrow r indicates the moving direction of the table. In the horizontal magnetic field type MRI apparatus as shown in (a), the static magnetic field direction corresponds to the r direction. In the vertical magnetic field type MRI apparatus as shown in (b), the moving direction of the table is orthogonal to the static magnetic field direction.

FIG. 2 is a block diagram showing a schematic configuration of the MRI apparatus, and the same elements shown in FIG. 1 are indicated by the same reference numerals. As is shown, in the static magnetic field (imaging space) produced by the static magnetic field magnet 101, there are arranged a shim coil 112 for enhancing homogeneities of the static magnetic field, a gradient magnetic field coil 102 that provides a gradient in the static magnetic field, an transmission coil 107 for producing a high frequency magnetic field for exciting a nucleus of the atom (proton, in general) constituting the tissue of the examination target (human being), a receiving coil 114 for detecting a nuclear magnetic resonance signal generated from the examination target, and the like. The table 301 on which the test object 103 is laid is controlled by the table controller 302, and it transfers the test object 103 into the imaging space, as well as moving the test object within the space. The table controller 201 is capable of controlling the speed and the position of the table as well as monitoring them.

The aforementioned shim coil 112, the gradient magnetic field coil 102, the transmission coil 107, and the receiving coil 114 are respectively connected to a shim power source 113, a gradient magnetic field power source 105, a high frequency magnetic field generator 106, and a receiver 108. Operations of these elements are controlled by a sequencer 104. The sequencer 104 controls these elements to operate at a timing and an intensity level (pulse sequence), which are programmed in advance, as well as controls a startup of the pulse sequence in accordance with the drive of the table controller. The MRI apparatus is further provided with a computer 109, a display 110, a storage medium 111, and the like, as a signal processing system.

In the configuration above, a high frequency magnetic field generated by the high frequency magnetic field generator 106 is applied to the examination target 103 via the transmission coil 107. The receiving coil 114 receives the signal generated from the examination target 103, and the signal is detected by the receiver 108. A nuclear magnetic resonance frequency using as a reference of the detection is set by the sequencer 104. The signal being detected is transferred to the computer 109, and it is subjected to a signal processing such as an image reconstruction. In the present invention, in particular, an image reconstructing computation peculiar to the moving table imaging as described below is carried out, in addition to a general correction computation, Fourier transform, and the like. A processing result of the computer 109 is displayed on the display 110, and recorded in the memory 111. The signal being detected and measuring conditions may be stored in the memory 111 as needed.

FIRST EMBODIMENT

Next, an embodiment of the moving table imaging method employed in the present invention will be explained. FIG. 3 shows a relationship between an area available for imaging (sub FOV) in the MRI apparatus and a wide field of view as a target for imaging (here, total FOV; total body of the test object). FIG. 4 shows a procedure of the imaging and the image reconstruction process.

In the moving table imaging, as shown in FIG. 3, the imaging is performed while the table 301 (examination target 103) is moved in the direction indicated by arrow 303. The receiving coil 114 may be a receiving coil fixed in the apparatus, or a combination of multiple coils fixed on the test object. Here, as shown in FIG. 3, there will be explained a case where the receiving coil fixed in the apparatus is used. A field of view (sub FOV) 304 of one-time signal acquisition can be set arbitrarily. However, optimally, the FOV is configured to be the size approximately the same as the area that is capable of receiving a sufficiently high signal. The size of the FOV corresponding to one-time signal acquisition is limited, but an image of the total body (total FOV) 305 is taken by performing the imaging while the table 301 is moved. Any of 2D imaging and 3D imaging may be available, and a sliding phase encode direction is set as a table moving direction. By way of example, in the 2D imaging, an imaging plane may be any of coronal plane and sagittal plane, and any imaging plane is applicable as far as it includes an axis of the table moving direction within its plane. A read-out direction is selected as a direction orthogonal to the table moving direction. In the following embodiment, the explanation will be made taking the 2D imaging by way of example. However, if one encoding other than the sliding phase encode is added, it becomes 3D imaging.

As shown in FIG. 4(*a*), the imaging includes a step 601 to obtain device characteristics data 604 such as coil sensitivity, a step 602 to obtain examination target data 605, and a step 603 to calculate a reconstructed image 606 of the examination target, by using the device characteristics data and the examination target data.

In step 601, an imaging is performed to obtain the device characteristics data such as a static magnetic field map, an excitation map of the transmission coil 107, and a sensitivity map of the receiving coil 114. A publicly known method can be employed as a method to obtain the static magnetic field map, the excitation map of the transmission coil, and coil sensitivity map from an image. For example, the static magnetic fieldmap can be obtained by acquiring signals different in echo time, and detecting a phase difference of the signals generated in a difference of the time for acquiring the signals. The excitation map of the transmission coil can be obtained by acquiring signals different in transmission power, and detecting an intensity difference. The sensitivity map can be obtained by comparing image data provided by a coil such as a body coil, having a homogeneous sensitivity map, with image data provided by the coil used in the imaging of step 602. Alternatively, if homogeneous phantom image data is acquired, only this data may indicate the device characteristics data combining all the effects of the static magnetic field, the excitation, and the sensitivity. Furthermore, using the device characteristics obtained by the homogeneous phantom as a base, a part of the static magnetic map, the excitation map, and the sensitive map may be replaced by the device characteristics obtained from the actual test object, thereby enabling an acquisition of more accurate device characteristics data. The device characteristics data as thus obtained is used for the image reconstruction described below.

Hereinafter, an imaging for obtaining the device characteristics data (device characteristics measurement) will be explained specifically. The device characteristics data may include gradient magnetic field non-linearity, static magnetic field inhomogeneity, excitation map of the transmission coil, the sensitivity map of the receiving coil, and the like. Since the gradient magnetic field non-linearity have little dependence on the test object, it is not necessary to acquire the nonlinearity every imaging time, and data measured by another measurement such as an imaging by the use of a phantom is stored in a memory beforehand. Therefore, in the device characteristics measuring step 601, an imaging is performed for obtaining the device characteristics data relating to the signal intensity and phase comprising the signal intensity map according to the static magnetic field inhomogeneity, the excitation map of the transmission coil 107, the sensitivity map of the receiving coil 114, and the like.

FIG. 4(*b*) shows details of the device characteristics measuring step 601. As illustrated, this imaging is performed by a multi-station imaging, in which the table moves to each station, and a step for executing RF transmitting and receiving is repeated in each station. Thereafter, image data of each station is obtained (step 631). For the imaging in the case above, a publicly known 2D imaging method or 3D imaging method can be employed. Since the device characteristics data varies smoothly in general, an imaging at low resolution is sufficient, and therefore the imaging time can be set to be short.

The device characteristics data can be obtained by dividing the image acquired in each station by a homogeneous image of the total FOV. The homogeneous image indicates an image that can be obtained under the conditions that the coil sensitivity and the like are homogeneous. The homogeneous image of the total FOV may be generated by synthesizing the images from each station, for instance (step 632, 633).

As shown in FIG. 5, in the imaging for the device characteristics data, the sub FOV for acquiring the device characteristics data is set sufficiently large to cover the total range where the signal acquisition is possible in the main scan. In addition, the sub FOV is configured in such a manner that the sub FOV items overlap on one another to some extent between the stations. Such overlapping of the sub FOV items facilitates merging into a homogeneous image, and interpolating of the device characteristics data. In order to obtain accurate device characteristics data, it is preferable to allow the sub FOV items to overlap in such a manner that the total FOV can be covered only by the particular areas which are considered to be homogeneous in the respective station images. On the other hand, in order to place a priority on the reduction of the imaging time rather than the accuracy, the overlapping may be reduced more. In order to generate more homogeneous total FOV image, it is possible to perform additional imaging that uses another coil such as a body coil.

When the image data is obtained by the imaging in each station, the images obtained in the respective stations are merged into a homogeneous image of the total FOV. Subsequently, each image obtained in each station is divided by the homogeneous image of the total FOV, and thereby obtaining the device characteristics data combining the signal intensity map according to the static magnetic inhomogeneity, the excitation map of the transmission coil, and the sensitivity map of the receiving coil, in a positional relationship between the test object and the coil in each station. It is to be noted that in the procedure above, the calculation is performed after the obtained image is subjected to low-pass filtering, or an area without the object is masked, as necessary. Accordingly, it is possible to acquire the device characteristics data stably against a noise.

The device characteristics data being obtained according to the above procedure is data peculiar to each station. However, in reconstructing an image, device characteristics data at each position of the test object is required, which continuously varies in the main scan. In reconstructing an image, the device characteristics data of the neighbor station may be used. Preferably, the device characteristics data at each position is generated by interpolating the device characteristics data between the stations. Accordingly, the device characteristics data at each position can be acquired efficiently.

Next, a step for acquiring the examination target data (main scan) 602 will be explained. In this step 602, as shown in FIG. 6(*a*), firstly, movement of the table is started (step 607). Next, an RF is transmitted and received (step 608). The transmission and receiving of the RF is repeated until the total FOV is covered by the table movement (step 609). After the total FOV is covered by the table movement, data acquisition is terminated (step 610).

In the case of the total body imaging as shown in FIG. 3, the table moving range to cover the total FOV corresponds to the moving range from the position of the test object and the table indicated by the broken line, to the position 301 of the examination target 103 and the table indicated by the solid line. In general, the table is moved from a position at a distance before the moving range, to use the distance as an approaching zone, in order that the data acquisition can be started after the table moving speed becomes constant. Furthermore, the data acquisition is started at a position where one end of the total FOV reaches the center of the signal acquisition area, and at the time when the other end of the total FOV reaches the center of the signal acquisition area, the data acquisition is terminated. The table controller 302 detects the table position, and transfers the information to the sequencer.

FIG. 7 shows one example of the pulse sequence employed by the imaging in step 608. In FIG. 7, RF indicates an excitation high frequency pulse, Gs indicates a slice selection gradient magnetic field, Gp indicates a sliding phase encode gradient magnetic field, and Gr indicates a read-out gradient magnetic field. This pulse sequence has an appearance similar to a general 2D gradient echo system pulse sequence. However, there is a difference in the point that Gp axis agrees with the table moving direction and a gradient magnetic field is applied by changing an application amount (intensity and application time) with respect to each acquisition data, which is obtained at different positions in the table moving direction. In the present invention, the gradient magnetic field of Gp axis is referred to as the sliding phase encode gradient magnetic field.

In the imaging, firstly, a slice gradient magnetic field for dephasing 203 is applied on the examination target, and prepared for balancing with the gradient magnetic field applied by the subsequent slice gradient magnetic field 202. Next, the excitation high frequency pulse 201 is applied simultaneously with the slice gradient magnetic field 202, and only a desired slice is excited. Accordingly, only a particular slice starts generating a magnetic resonance signal 208. Without any delay, a slice gradient magnetic field for rephasing 204 is applied, and a portion having been dephased by the slice gradient magnetic field 202 is rewound. Next, a sliding phase encode gradient magnetic field 205 is applied. Simultaneously, the read-out gradient magnetic field for dephasing 206 is applied to be prepared for balancing with a gradient magnetic field applied by the subsequent read-out magnetic field 207. Next, the read-out gradient magnetic field 207 is applied, and a signal is measured at the time when the magnetic resonance signal 208 once attenuated by the read-out magnetic field for dephasing 206 is heightened again. Finally, the sliding phase encode gradient magnetic field for rephasing 209 and the read-out gradient magnetic field for rephasing 210 are applied, and the encoding at the time of acquiring the magnetic resonance signal 208 is rewound. Then, preparation is made for the subsequent excitation high frequency pulse 211.

Excitation is applied by an excitation high frequency pulse 211 after a lapse of time TR from the excitation high frequency pulse 201, and the gradient magnetic field application and the signal measurement are repeated similar to the procedure as described above. In the repetition above, each of the sliding phase encode gradient magnetic field 205 and the sliding phase encode gradient magnetic field for rephasing 209 is changed, and positional information in the sliding phase encode direction is provided.

A relationship between the table moving speed v and TR is expressed by the following equation (1) in the case where the magnetic resonance signal 208 is acquired every TR time, while the table is moved:

[FORMULA 1]

$$V = FOV_{total}/N_{total}/TR \qquad (1)$$

In the equation, $FOV_{total}$ represents a size of the total FOV 305 in the table moving direction, and $N_{total}$ represents a matrix size of a reconstructed image in the table moving direction.

In repeating the acquisition of the magnetic resonance signal 208, a value G(n) of the sliding phase encode gradient magnetic field 205 in the n-th repetition is expressed by the following equation (2), assuming the maximum value of the sliding phase encode gradient magnetic field as $G_{max}$:

[FORMULA 2]

$$G(n) = G_{max} \times (n\%N_{sub} - N_{sub}/2)/(N_{sub}/2)$$

In the equation, $N_{sub}$ is an integer number that is the closest to;

[FORMULA 3]

$$[N\text{total} \times FOV\text{sub}/FOV\text{total}]$$

and $n\%N_{sub}$ indicates a remainder obtained by dividing n by $N_{sub}$.

By providing the sliding phase encode as thus described, signal S(n,ky) is obtained. In the S(n,ky), ky represents a coordinate in the k-space corresponding to the y-direction (read-out direction). The S(n,ky) is a signal value of the magnetic resonance signal received at the n-th time, on the point ky in the k-space. As shown in FIG. 8(a), the signal S(n,ky) is stored as measured data, in the measurement memory 401 so as to reconstruct an image.

In calculating the reconstructed image (step 603), an image reconstruction computation is conducted, by using the measured data 605 of the examination target as described above, and the device characteristics data 604 obtained in step 601. The image reconstruction computation determines a magnetic moment map of the examination target in such a manner that the sum of the square of a difference is minimized, the difference between a signal calculated using as a variable the magnetic moment map of the examination target (initial value), and a signal actually received. Hereinafter, details of the above procedure will be explained.

The signal S(n,ky) being measured can be expressed by the next equation (3) by using the positional information of the table;

[FORMULA 4]

$$S(n, k_y) = \int_{r=0}^{FOV_{total}} M(r, k_y) \exp(-r'k(n)(1 + d(r')))w_n(r')dr \qquad (3)$$

The signal S(n,ky) having been subjected to the Fourier transform in the read-out direction (y-direction) is expressed by the following equation (4);

[FORMULA 5]

$$s(n, y) = \int_{r=0}^{FOV_{total}} m(r, y)\exp(-r'k(n)(1 + d(r')))w_n(r')dr \quad (4)$$

In the equations (3) and (4), r represents a position in the table moving direction in the coordinate system fixed on the test object, r' represents a position in the table moving direction in the static coordinate system fixed on the entire apparatus, and they are expressed as the following;

[FORMULA 6]

$$r' = r - r_{table}(n) \quad (5)$$

It is to be noted here that $r_{table}(n)$ represents a table travel distance at the time of acquiring the magnetic resonance signal at the n-th time, and it can be obtained by the next equation (6);

[FORMULA 7]

$$r_{table}(n) = n \cdot v \cdot TR \quad (6)$$

On the other hand, k(n) corresponds to a phase rotation which the n-th time magnetic resonance signal undergone by the sliding phase encode gradient magnetic field, and it is defined by the following equation (7). When the above definition is expressed by a graph, it is shown as FIG. 9.

[FORMULA 8]

$$k(n) = \int \gamma G(n) dt \quad (7)$$

In the equation, γ represents a gyromagnetic ratio. If there exist non-linearity of the gradient magnetic field, and the magnitude of gradient magnetic field of G(n) is displaced to be G(n) (1+d(r')), the phase rotation according to the actual gradient magnetic field is;

[FORMULA 9]

$$\int \gamma G(n)(1+d(r'))dt = (1+d(r'))\int \gamma G(n)dt = (1+d(r'))k(n)$$

The item of k(n)(1+d(r')) in the equations (3) and (4) considers the gradient magnetic field non-linearity.

Function wn(r') represents magnitude and phase of the signal obtained from the magnetization with a magnitude of 1 at the position r', in the positional relationship between the test object and the coil at the time of acquiring (receiving) a signal at the n-th time, and this function is determined by the static magnetic fieldmap, the excitation map of the RF coil, and the sensitivity map of the receiving coil. These are obtained by measuring the device characteristics data in step 601. If the static magnetic field map, the excitation map of RF coil, and the sensitivity map of the receiving coil are homogeneous within the signal acquisition area (sub FOV, a length in the table motion direction is FOV sub), and the receiving coil does not have a sensitivity outside the sub FOV, $w_n(r')$ is a step-like function as shown in FIG. 10. Here, m(r,y) is a magnetization at the position of the test object (r,y), namely, an image of the examination target to be obtained, and M(r, ky) corresponds to the result obtained by subjecting m(r,y) to the inverse Fourier transform with respect to y.

The signal s(n,y) obtained by subjecting the signal S(n,ky) to the Fourier transform in the read-out direction is stored in the intermediate memory 402 as shown in FIG. 8(b). As for the signal S(n,ky), a series of phase encode from −π to π is performed on different positions of the examination target. Therefore, m(r,y) cannot be solved by the Fourier transform method as done conventionally. Considering this situation, according to the present invention, a presumptive magnetization map m'(r,y) is set as a variable, and a magnetic resonance signal s'(n,y) is obtained by calculation according to the equation (4), by using this m'(r,y). In order to solve the equation (4), it is necessary to know r', k(n), (1+d(r')), and $w_n$(r'). As described above, r' can be obtained by the equation (5), and k(n) can be obtained by the equation (7). Furthermore, (1+d (r')) is data representing non-linearity of the gradient magnetic field, and this data has been obtained beforehand. Here, $w_n$(r') can be obtained by the measurement in step 601. Therefore, by setting m'(r,y), s'(n,y) can be obtained by the computation according to the equation (4).

The image reconstruction is executed by obtaining m(r,y) that minimizes the sum of square of the absolute value of the difference between the magnetic resonance signal s'(n,y) obtained by the computation, and the magnetic resonance signal s(n,y) actually measured (following equation (8)).

[FORMULA 10]

$$\sigma^2 = \Sigma_n |s(n,y) - s'(n,y)|^2 \quad (8)$$

As the presumptive magnetization map m'(r,y), zero value may be used for instance, or a positioning image may be utilized, which is obtained by measuring the examination target in advance at a low spatial resolution. In the latter case, the optimization related to the equation (8) needs only a short period of time to converge to a result.

A procedure to execute such image reconstruction as described above will be shown in FIG. 6(b). Firstly, the magnetization map 612 of the examination target, as a decision variable, is initialized (step 611). As mentioned above, either zero value or positioning image data if exists is used as an initial value. Subsequently, by using the initial value 612 of the magnetization map set in the step 611 and the device characteristics data, examination target data 614 is obtained by calculation according to the equation (4). It is determined whether the mean square error between the examination target data obtained by calculation (calculated data) 614 and the examination target data actually measured (measured data) 605 is sufficiently small (step 615). If it is sufficiently small, the magnetization map used in the calculation above is set as an image of the examination target and the image reconstruction computation is terminated (step 617). In step 615, if the mean square error is determined as equal to or more than a preset threshold, for instance, the decision variable is changed so that the mean square error is reduced (step 616), and then step 613 and step 615 are repeated. The m(r,y) obtained according to the above procedure is stored in the image memory 403 as shown in FIG. 8(c).

As discussed above, according to the present embodiment, an imaging is performed, which provides a sliding phase encode in the table moving direction, and the image reconstruction is executed by the computation using the presumptive magnetization map as the decision variable in optimization. Thereby, even if the area available for imaging (sub FOV) in the table moving direction is narrow, an imaging of an expanded FOV is possible while maintaining an image quality equivalent to a conventional method, without extending the imaging time. Conventionally, if the phase encode is performed in the table moving direction, it has been impossible to execute the image reconstruction using the Fourier transform. However, use of the optimization method which minimizes the mean square error, instead of the Fourier transform, enables image reconstruction. Moreover, according to the present invention, the device characteristics data required for the reconstruction is measured by the multi-station imaging method, and thereby facilitating the acquisition of approximate device characteristics data within a relatively short period of time. In the embodiment above, the pulse sequence as shown in FIG. 7 is taken as an example of the imaging method. It is further possible to perform 3D imaging by providing a phase encode in the slice direction to this pulse sequence, for instance. In this case, the image reconstruction can be executed in a similar manner as described above, only by increasing a positional dimension of the signal to be processed.

SECOND EMBODIMENT

In the above embodiment, there has been explained a case where the table moving speed is constant. However, the present invention is also applicable to the case where the table moving speed is not constant. Hereinafter, as the second embodiment of the present invention, the case where the table moving speed is not constant will be explained.

In the present embodiment, a configuration of the apparatus and a procedure of the imaging are the same as the first embodiment described above. In other words, in step 601, the device characteristics data 604 such as the coil sensitivity is acquired, and subsequently in step 602, the examination target data 605 is acquired. Finally in step 603, the reconstructed image 606 of the examination target is calculated by using the device characteristics data 604 and the examination target 605. It is to be noted that in the present embodiment, the sequencer 104 changes the table moving speed, following a program previously configured, or by a designation by a user. The table position at the time of signal acquisition can be figured out by the table controller. Therefore, if a relationship between the table position and the sliding phase encode is decided as shown in FIG. 9, an encoding amount at each signal receiving is determined according to this relationship. By way of example, the pulse sequence is changed so that the number of steps of the sliding phase encode is increased during the period when the table moving speed is low. In the pulse sequence as shown in FIG. 7, the application amount of the sliding phase encode gradient magnetic field 205 and that of the gradient magnetic field for rephasing 209, which vary every TR, are determined by the table position.

In the image reconstruction step 603 to obtain m(r,y) from the signal s(n,y) being obtained, following procedure is the same as the first embodiment: a signal s'(r,y) is obtained by calculation according to the equation (4) by using the magnetization map m'(r,y) as a variable; Then, a magnetization map m(r,y) that minimizes the sum of the square of the difference between the signal s'(r,y) and the magnetic resonance signal s(n,y) actually measured is obtained. It is to be noted here that a value obtained by the table controller is used as $r_{table}(n)$, which is a table travel distance at the time of acquiring the n-th magnetic resonance signal to obtain the signal s'(r,y) in the equation (4).

[FORMULA 11]

$$s(n, y) = \int_{r=0}^{FOV_{total}} m(r, y)\exp(-r'k(n)(1 + d(r')))w_n(r')dr \quad (4)$$

Here, k(n) represents a function (graph) shown in FIG. 9, and the function $w_n(r')$ is the device characteristics data measured in the step 601. Accordingly, the magnetization map m(r,y) being obtained is stored in the image memory 403 as image data, and displayed as a tomographic image of wide field of view showing the examination target.

As thus described, according to the present embodiment, it is possible to reduce the imaging time for the sub FOV, in response to a decrease of the area available for imaging (sub FOV) in the table moving direction, similar to the first embodiment. Therefore, the imaging time as a whole will never be extended. In addition, in the present embodiment, since the speed can be made variable, it is applicable to various imaging, such as an imaging that chases a contrast agent within a blood vessel, or an imaging that takes a long time only on a part where detailed imaging is required. Therefore, flexibility in imaging is increased.

THIRD EMBODIMENT

Next, a third embodiment of the present invention will be explained. The present embodiment features that the table is reciprocated, and device characteristics data is acquired while going forward and measured data of the examination target is acquired while going backward. A flow of the imaging according to the present embodiment is shown in FIG. 11.

As illustrated, firstly, while the table is moved by the total FOV (step 620), the device characteristics data 604 such as the coil sensitivity is acquired (step 621). The device characteristic data 604 is stored in the memory. Next, the table is moved in the reverse direction (step 622), and data of the examination target 605 is acquired (step 623). The data of the examination target 605 is stored in the measurement memory 401. Finally, by using the device characteristics data 604 and the examination target data 605, the reconstructed image 606 of the examination target is calculated (step 624).

The step 623 to acquire the examination target data and the step 624 to calculate the reconstructed image are the same as the first embodiment or the second embodiment. When the table moving speed is constant, similar to the first embodiment, a sliding phase encode is given based on the relationship between the table position information at the time of signal acquisition determined by the table moving speed, and the sliding phase encode amount as shown in FIG. 9, and a theoretical signal value is obtained by using the table position information at the time of signal acquisition time determined by the table moving speed. On the other hand, if the table moving speed is changed arbitrarily, similar to the second embodiment, the table position information at the time of signal acquisition time obtained from the table controller is used, as to the determination of the sliding phase encode amount and a pixel position of the signal.

In the present embodiment, in addition to the effects of the aforementioned first and the second embodiments, two data items, device characteristics data and the examination target data can be taken, by one-time reciprocation of the table (ordinary coming in and going out of the apparatus). Therefore, there is another effect that the time spent for total examination can be shortened. It is to be noted that the device characteristics data (function $w_n$ in the equation (4)), not a value of ideal system as shown in FIG. 10 but a value actually measured when the examination target exists within the apparatus is employed. Therefore, a higher quality image can be obtained. Furthermore, by acquiring in advance a low spatial resolution image data as the device characteristics data, it is possible to utilize this data as an optimized variable (m'(r,y)) at the time of the image reconstruction computation, whereby the time of the optimization computation can be reduced.

FOURTH EMBODIMENT

Next, a fourth embodiment of the present invention will be explained. Also in the fourth embodiment, a configuration of the apparatus and a procedure of the imaging are the same as the first embodiment described above. In other words, as shown in FIG. 4(a), in step 601, the device characteristics data 604 such as the coil sensitivity is acquired, and subsequently in step 602, the examination target data 605 is acquired. Finally in step 603, the reconstructed image 606 of the examination target is calculated by using the device characteristics data 604 and the examination target data 605. It is to be noted there that in the present embodiment, 3D imaging is employed as an imaging method in step 602.

FIG. 12 shows an example of the pulse sequence employed in the present embodiment. In the figure, RF represents an excitation high frequency pulse, Gs represents a slice selection gradient magnetic field, Gp represents a sliding phase encode gradient magnetic field, and Gr represents a read-out gradient magnetic field. This pulse sequence has an appearance similar to a general 3D gradient echo system pulse sequence. However, there is a difference in the point that Gp axis agrees with the table moving direction, functioning as a sliding phase encode axis, and Gs axis serves as the phase encode axis.

In this pulse sequence, firstly, the slice gradient magnetic field for dephasing 203 is applied to the examination target, and thus prepared for balancing with the gradient magnetic field applied by the subsequent slice gradient magnetic field 202. Next, an excitation high frequency pulse 201 is applied simultaneously with the slice gradient magnetic field 202, and only a desired slice is excited. Accordingly, only a particular slice starts generating a magnetic resonance signal 208. Without any delay, a slice gradient magnetic field for rephasing 204 is applied, and a portion having been dephased by the slice gradient magnetic field 202 is rewound.

Next, the phase encode gradient magnetic field 215 and the sliding phase encode gradient magnetic field 205 are applied. Simultaneously, the read-out gradient magnetic field for dephasing 206 is applied, and thus prepared for balancing with the gradient magnetic field to be applied by the subsequent read-out gradient magnetic field 207. Next, the read-out gradient magnetic field 207 is applied, and a signal is measured at the time when the magnetic resonance signal 208 once attenuated by the read-out magnetic field for dephasing 206 is heightened again. Next, the phase encode gradient magnetic field for rephasing 216, the sliding phase encode gradient magnetic field for rephasing 209, and the read-out gradient magnetic field for rephasing 210 are applied, and the encoding at the time of acquiring the magnetic resonance signal 208 is rewound. Thus, preparation is made for the subsequent excitation high frequency pulse 211.

Excitation is applied by the excitation high frequency pulse 211 after a lapse of TR from the excitation high frequency pulse 201. Similar to the aforementioned explanation, the application of the gradient magnetic field and the signal measurement are repeated. In the repetition above, for example, while the sliding phase encode gradient magnetic field 205 and the sliding phase encode gradient magnetic field for rephasing 209 are set to be constant, the phase encode gradient magnetic field 215 and the phase encode gradient magnetic field for rephasing 216 are sequentially varied to measure a signal of a series of phase encode (internal loop measurement). Next, the similar internal loop measurement is conducted using a different sliding phase encode gradient magnetic field 205 and the sliding phase encode gradient magnetic field for rephasing 209. Finally, the signals of the entire phase encode as to the entire sliding phase encode are measured. Accordingly, it is possible to obtain a signal which is provided with position information both in the slice direction and in the sliding phase encode direction.

In the case where a magnetic resonance signal 208 is acquired every TR time as thus described, a relationship between the table moving speed v and TR is expressed by the following equation (9).

[FORMULA 12]

In the equation, $FOV_{total}$ represents a size of the total FOV 305 in the table moving direction, $N_{total}$ represents a matrix size of the reconstructed image in the table moving direction, and Ns represents a phase encode number in the slice direction.

In the repetition of the acquisition of the magnetic resonance signal 208, a value G(n) of the sliding phase encode gradient magnetic field 205 in the n-th repetition in the j-th phase encode step in the slice direction (in the entire imaging, it is m(=j+Ns(n−1))th) is expressed by the aforementioned equation (2), assuming the maximum value of the sliding phase encode gradient magnetic field as $G_{max}$.

The measured signals S(n, kx, ky) can be expressed by the following equation (10) using the positional information of the table.

[FORMULA 13]

$$S(n, k_x, k_y) = \int_{r=0}^{FOV_{total}} M(r, k_x, k_y) \exp\left(\frac{-r'k(n)}{(1+d(r'))}\right) w_n(r') dr \quad (10)$$

Here, kx and ky represent coordinates in the k-space, respectively corresponding to the slice direction (x-direction) and the read-out direction (y-direction). Here, n represents that it is the n-th sliding phase encode. When the signal S(n, kx, ky) is subjected to the Fourier transform in the slice direction (x-direction) and in the read-out direction (y-direction), it is expressed by the following equation (11).

[FORMULA 14]

$$s(n, x, y) = \int_{r=0}^{FOV_{total}} m(r, x, y) \exp\left(\frac{-r'k(n)}{(1+d(r'))}\right) w_n(r') dr \quad (11)$$

In those equations (10) and (11), r represents a position of the table in its moving direction in the coordinate system fixed on the test object, and r' represents a position of the table in its moving direction in a static coordinate system fixed on the entire apparatus, and they are expressed by the following:

[FORMULA 15]

$$r' = r - r_{table}(n) \quad (5)$$

Here, $r_{table}(n)$ represents a table travel distance at the time of acquiring the n-th magnetic resonance signal. In addition, k(n) corresponds to the phase rotation which the magnetic resonance signal undergone by the n-th sliding phase encode gradient magnetic field, and it is defined by the aforementioned equation (7). If only the two elements are graphed, it looks like the graph as shown in FIG. 9. Here, $w_n(r')$ is a function that is obtained by measuring the device characteristics data.

As shown in FIG. 13, the signal S(n, kx, ky) being measured is stored in the measurement memory 401, and the signals (n, x, y), which is obtained by subjecting S(n, kx, ky) to the Fourier transform in the slice direction (x-direction) and in the read-out direction (y-direction), is stored in the intermediate memory 402.

Also in this case, as to the signal s(n, x, y), a series of phase encode from −π to π is executed at different positions on the examination target. Therefore, m(r, x, y) cannot be solved by the Fourier transform method according to the equation (11). Then, the presumptive magnetization map m'(r, x, y) is set as a variable, and the magnetic resonance signal s'(n, x, y) is obtained by calculation according to the equation (11) by using the m'(r, x, y). The image reconstruction is executed by obtaining m(r, x, y) that minimizes the sum of square of the absolute value of the difference between the magnetic resonance signal s'(n, x, y) obtained by the calculation, and the magnetic resonance signal s(n, x, y) actually measured. Also in the present embodiment, zero value may be used as the presumptive magnetization map m'(x, y, z), or a positioning image that is obtained by measuring in advance the examination target at a low spatial resolution.

The 3D image data having been obtained is stored in the image memory 403, and it is displayed as a tomographic image of a certain imaging plane, or if necessary, it is subjected to an image processing such as projection and volume rendering and thereafter displayed.

According to the present embodiment, it is possible to expand the field of view not only on the plane, but also as a volume. If the volume is obtained by using the method for expanding the field of view on the plane, it is necessary to reciprocate the table many times, and therefore it is inefficient and uncomfortable for the patient. In the 3D imaging method, however, the imaging is completed only by one-time table movement, and therefore the volume imaging can be performed efficiently and comfortably. Also in the present embodiment, it is possible to make the table moving speed variable as necessary, similar to the second embodiment. In addition, similar to the third embodiment, the table is reciprocated and the device characteristics data is acquired while going forward, and the data of the examination target is measured while going backward, for instance.

FIFTH EMBODIMENT

In the embodiments described above, there has been explained a case where imaging is performed to acquire the device characteristics data, independently of the main scan. However, the acquisition of the device characteristics data may be performed simultaneously with the main scan. Hereinafter, as a fifth embodiment of the present invention, a method that obtains the device characteristics data simultaneously with the main scan will be explained with reference to FIG. 14 and FIG. 15. Also in the present embodiment, a configuration of the apparatus is the same as the aforementioned first embodiment. However, as shown in FIG. 14(a), in the imaging procedure of the present embodiment, acquisition of the device characteristics data is performed simultaneously with the main scan (625), and in the next step, a reconstructed image of the examination target is calculated by using the device characteristics data and the examination target data (626).

Such simultaneous acquisition of the device characteristics data is achieved by utilizing only low frequency data within a frequency domain in the main scan. In other words, only the low frequency element is taken from SPE data obtained in the main scan, and a low frequency image used for the device data is acquired by the Fourier transform. On this occasion, if the area available for signal acquisition cannot be included in the sub FOV, the density of the low frequency data is increased to expand the FOV. By way of example, as shown in FIG. 14(b), the main scan is performed while the table is moved in the same manner as the main scan of the first embodiment (627, 628), and only in the low frequency area, the sliding phase encode step is increased by 0.5 (629).

Out of the SPE data obtained by such imaging as described above, the low frequency data being measured densely is taken, and it is firstly subjected to an origin correction (FIG. 15, step 641). Since the main scan is performed while the table position is moved, the origin position is different every signal acquisition. Such difference of the origin position may indicate a displacement of an offset value of the gradient magnetic field. Correction of the origin position is to correct such displacement of the offset value of the gradient magnetic field, and the correction can be performed by multiplying the signal by $\exp(-r_{table}(n)k(n)(1+d(r')))$, namely, the following equation (13) is executed.

[FORMULA 16]

$$S(n, k_y) \times \exp\left(\frac{-r_{table}(n)k(n)}{(1+d(r'))}\right) = \int_{r=0}^{FOV_{total}} M(r, k_y) \exp\left(\frac{-rk(n)}{(1+d(r'))}\right) w_n(r')dr \quad (13)$$

The above equation (13) includes the item of non-linearity of the gradient magnetic field. However, if the degree of the non-linearity of the gradient magnetic field is ignorable, the signal may be multiplied by $\exp(-r_{table}(n)k(n))$. The processing in this case is expressed by the following equation (14).

[FORMULA 17]

$$S(n, k_y) \times \exp(-r_{table}(n)k(n)) \approx \int_{r=0}^{FOV_{total}} M(r, k_y) \exp(-rk(n)) w_n(r')dr \quad (14)$$

After the origin position is corrected, as shown in FIG. 15, by filling the high frequency area with zero to fill the k-space, and k-space data for a piece of low frequency image is generated (step 642). This k-space data is subjected to the Fourier transform, whereby a low frequency image at one table position can be acquired (step 643). In the sliding phase encode that performs the phase encode in the table moving direction, the FOV is different by data acquisition. Therefore, in general, image reconstruction by the Fourier transform cannot be performed. However, if only the low frequency data is used, variation of the table position is small and the FOV is not changed drastically. Accordingly, as far as the origin position is corrected for each data, an approximate image reconstruction by the Fourier transform becomes possible.

This low frequency image can be obtained with respect to each one loop of the sliding phase encode. By using the low frequency image data at each position, it is possible to generate the device characteristics data in the same manner as the first embodiment. Specifically, the device characteristics data can be obtained, by dividing each low frequency image data by homogeneous image data of the total FOV. The device characteristics data obtained at each position is interpolated, and aggregative device characteristics data is generated (644). It is to be noted that a distance between the positions where the device characteristic data can be acquired is determined by the loop number of the sliding phase encode. The shorter the distance is, that is, the denser the each image acquiring position is, which is used to obtain the device characteristics data, generation of the homogeneous image and interpolation of the device characteristics data become more accurate. In the present embodiment, the distance between the image acquiring positions can be narrowed by making the table moving speed lower, or making the sliding phase encode step sparser, so as to increase the number of loops of the sliding phase encode as shown in FIG. 16(a).

In the meantime, there has been explained a case where the sliding phase encode step in the low frequency area is increased by 0.5. In this case, the signal acquisition number of times is increased, and therefore the imaging time of the main scan is extended. In order to suppress the extension of the imaging time of the main scan, as shown in FIG. 17, the sliding phase encode step is increased in the high frequency area, for example, by two steps, thereby decreasing the signal acquisition number of times. FIG. 16(b) shows such variation of the sliding phase encode amount, and FIG. 18 shows the SPE data obtained in the imaging according to such sliding phase encode step.

The calculation method to reconstruct an image by using the device characteristics data being obtained according to the aforementioned procedure, and simultaneously acquired image data, is the same as the first embodiment. According to the present embodiment, it is not necessary to perform imaging to acquire the device characteristics data independently of the main scan, whereby it is possible to reduce the imaging time as a whole.

SIXTH EMBODIMENT

In the embodiments as described above, there has been explained a case where the receiving coil is fixed on the apparatus. However, it is applicable to fix the receiving coil on the test object. Firstly, a method will be explained as the sixth embodiment, where the device characteristics data is previously acquired by using the coil fixed on the test object, and thereafter the main scan is performed.

Also in the present embodiment, similar to the first embodiment as shown in FIG. 4(a), the device characteristics measurement 601 is performed prior to the main scan 602, and then the image reconstruction 603 is performed by using the device characteristics data. However, in the present embodiment, as shown in FIG. 19, the coil 114 is fixed on the test object 103. Therefore, the coil 114 is moved in accordance with the movement of the test object (table 301), and in order to take an image of the total FOV, multiple coils are used by switching. In switching such multiple coils, plural coils may be used simultaneously for receiving.

A signal obtained by such an imaging as described above, a dimension corresponding to an assigned number of each coil is added, so as to discriminate the signals obtained from the respective coils, and the image reconstruction to which the equation (8) is applied is executed. By way of example, signal S(n, ky, c) obtained from the c-th coil is expressed by the following equation (15).

[FORMULA 18]

$$S(n, k_y, c) = \int_{r=0}^{FOV_{total}} M(r, k_y) \exp\left(\frac{-r'k(n)}{(1+d(r'))}\right) w_{n,c}(r')dr \quad (15)$$

Here, it is possible to combine the dimension representing the coil number and the dimension representing the signal number n, and the signals can be treated as n×c signals. Therefore, the calculation of the image reconstruction can be performed by applying the equations (3) and (4), and the equation (8). In other words, a grand total according to the equation (8) is calculated as to n,c as shown in the following equation (16).

[FORMULA 19]

$$\sigma^2 = \Sigma_{n,c}|s(n,y,c)-s'(n,y,c)|^2 \quad (16)$$

On the other hand, as to the device characteristics data acquisition 601, the device characteristics data $w_{n,c}(r')$ as shown in the equation (15) is obtained with respect to each coil. At first, there will be explained a case where, as to the c-th coil, the device characteristics data relating to the signal received from that coil is acquired.

Optimally, as shown in FIG. 20, a station is configured so that an area where the static magnetic field map and the excitation map of the transmission coil are homogeneous can cover the sensitivity area of the receiving coil, by one-time imaging or multiple times of imaging. Homogeneous areas are cut out from the imaging result, and pieced together, whereby it is possible to generate an image of total sensitivity area of the receiving coil, when the static magnetic field and the transmission are homogeneous. In the example as shown in FIG. 20, by combining (synthesizing) the image 1601b where the static magnetic field and the transmission are homogeneous in the first station image 1601, and the image 1602a where the static magnetic field and the transmission are homogeneous in the second station image 1602, whereby an image 1603 of the total sensitivity area of the receiving coil can be obtained. An image expressing this sensitivity map is divided by the homogeneous image 1600 generated by a general multi-station imaging method, and thereby a sensitivity map of the c-th coil can be obtained.

<Image 1603>/<Homogeneous image 1600>=<Sensitivity Map of the c-th coil>

Next, by dividing the image obtained at the c-th coil by the image 1603, it is possible to obtain other device characteristics, the static magnetic inhomogeneity and the transmission coil excitation map. In the example of FIG. 20, each of the image 1601 obtained in the station 1 and the image 1602 obtained in the station 2 is divided by the combined image 1603, whereby the device characteristics data in the station 1 and in the station 2, other than the sensitivity map, can be obtained.

<Image 1601>/<Image 1603>=<Device characteristics of Station 1>

<Image 1602>/<Image 1603>=<Device characteristics of Station 2>

The device characteristics data $w_{n,c}(r')$ as to the c-th coil can be acquired by multiplying the receiving coil sensitivity map, the static magnetic inhomogeneity, and the transmission coil excitation map.

By subjecting other coils to the same processing, it is possible to obtain the device characteristics data $w_{n,c}(r')$ including the sensitivity map, as to all the coils. After the device characteristics data is acquired, the step for acquiring the examination target data 605 and the step for calculating the reconstructed image 606 of the examination target by using the device characteristics data and the examination target data can be performed, similar to the first embodiment as described above. Also in this case, the device characteristics data obtained in each position may be interpolated, or in conducting the image reconstruction, the device characteristics data at the closest position may be used.

SEVENTH EMBODIMENT

Next, as the seventh embodiment, there will be explained a method in which the device characteristics data acquisition is performed simultaneously with the main scan, by using the coils fixed on the test object. In this case, an imaging similar to the fifth embodiment is performed, and in acquiring the device characteristics data, a consideration is given that the coils are distinguished from one another, setting the signal obtained from the c-th coil as S(n, ky, c), and this is similar to the sixth embodiment.

Firstly, also in the present embodiment, the configuration of the apparatus is the same as the sixth embodiment described above. Just like the procedure of the imaging in the fifth embodiment as shown in FIG. 14, the device characteristics data acquisition and the main scan are simultaneously executed in step 625, and in step 626, a reconstructed image 606 of the examination target is calculated by using the device characteristics data 604 and the examination target data 605.

Also in the present embodiment, the simultaneous acquisition of the device characteristics data uses only low frequency data in the frequency domain, and the correction of origin position for each data and the approximate image reconstruction by the Fourier transform are performed. This is similar to the fifth embodiment. However, in the present embodiment, similar to the sixth embodiment, the device characteristics data is acquired with respect to each coil.

Here, a case will be considered, where firstly focusing attention on the c-th coil, and then, the device characteristics data relating to the signal received from this coil is acquired. Optimally, as shown in FIG. 20, a position for acquiring low frequency data is configured, so that an area being homogeneous both in the static magnetic field map and in the transmission coil excitation map covers the sensitivity area of the receiving coil by one-time imaging or multiple times of imaging. While FIG. 20 shows a coil position in the multi-station, in this case the sliding phase encode step is executed while moving the table (i.e., the coil), in such a manner as the following: when the sliding phase encode step is configured as shown in FIG. 15, a center position of the first loop (from $-\pi$ to $\pi$) of the sliding phase encode (a position for acquiring a low frequency substance) corresponds to the first imaging position in FIG. 20; and the center position of the second loop (a position for acquiring a low frequency substance) corresponds to the second imaging position in FIG. 20. A method of reconstructing a piece of image by cutting out low frequency data from the SPE data is the same as the fifth embodiment. By cutting out the low frequency data from each of the images respectively obtained by executing the first loop and the second loop, the data is subjected to the origin correction. Then, the high frequency data is filled with zero, and subjected to the Fourier transform, thereby reconstructing an image.

Next, a homogeneous image is generated from each image having been reconstructed as described above. The homogeneous image may be obtained by adding each of the images, or by cutting out only the homogeneous part to be used. Alternatively, the homogeneous image may be acquired by the multi-station imaging in advance.

Similar to the sixth embodiment, the device characteristics data is obtained from the image of each coil and the homogeneous image being generated as described above. Specifically, firstly, as to the c-th coil, an image obtained by combining images obtained at each acquisition position is divided by the homogeneous image, thereby obtaining the c-th coil sensitivity map. Next, as to the c-th coil, the image at each acquisition position is divided by the image obtained by combining the image of each acquisition position, thereby obtaining the device characteristics other than the sensitivity map at each acquisition position.

<Image 1603>/<Homogeneous image 1600>=<Sensitivity map of the c-th coil>

<Image 1601>/<Image 1603 including an effect by the sensitivity map only>=<Device characteristics at the acquisition position 1>

<Image 1602>/<Image 1603 including an effect by the sensitivity map only>=<Device characteristics at the acquisition position 2>

By multiplying the sensitivity map, the static magnetic field inhomogeneity, and the excitation map of the transmission coil, the device characteristics data can be obtained entirely. Also in this case, the device characteristics data obtained at each acquisition position may be interpolated. Alternatively, in reconstructing an image, the device characteristics data at the closest acquisition position may be used. The image is reconstructed from the signals obtained by the main scan and the signals calculated by using the device characteristics data, and this is the same as the aforementioned embodiments.

EXAMPLE

In order to confirm the effect of the present invention, using the examination target as shown in FIG. 21, a comparative experiment was conducted between a conventional moving table imaging, and the moving table imaging according to the first embodiment and the fifth embodiment. As shown in FIG. 21, the figure (b) on the lower side shows a two-dimensional image of the examination target, and the figure (a) on the upper side shows one-dimensional profile projecting the image on the r-axis. In figure (b), r-axis and y-axis are axes indicating a position, and the scale is set in such a manner that a pixel size is 1. The vertical axis of the profile shown in the figure (a) indicates a pixel value. The examination target includes multiple slits. Each width of the slits on the leftmost edge and on the center is one pixel, and there are arranged slits having the width expanded by one pixel, respectively on the right sides of the slits above. In the figure (b), the area indicated by the color of white is an area where the examination target exists, with an area there between where the examination target does not exist.

The settings of the imaging parameters are configured as the following; sub FOV=420 mm×210 mm (64 pixels×32 pixels), total FOV=420 mm×1260 mm (64 pixels×192 pixels).

In the imaging according to the first embodiment, r-axis direction was set as the table moving direction, and the sliding phase encode was performed in this direction. The direction of y-axis, which was orthogonal to the table moving direction, was set as the read-out direction. In addition, it was performed under the condition of SNR=60, and $w_n(r')$ indicating the signal acquisition range was defined as a stepwise function as shown in FIG. 10. In the imaging according to the fifth embodiment, r-axis direction was set as the table moving direction, and the sliding phase encode was performed in this direction. The direction of y-axis, which was orthogonal to the table moving direction, was set as the read-out direction. In addition, it was performed under the condition of SNR=50. In the conventional moving bed imaging, r-axis direction was set as the table moving direction, and this direction was set as the read-out direction. The direction of y-axis, which was orthogonal to the table moving direction, was set as the sliding phase encode direction.

FIG. 22 shows a reconstructed image obtained in the conventional moving table method; FIG. 23 shows a reconstructed image obtained by the first embodiment; and FIG. 24 shows a reconstructed image obtained by the fifth embodiment. The scale used in FIG. 22 to FIG. 24 is set in such a manner that the pixel size is 1, which is the same as used in FIG. 21. As seen from the comparison of the images, any of the images were resolved into the slits having one pixel width, and it was confirmed that the resolution is sufficient. The SNR of the first embodiment was 60 and it was equal to the level of the conventional method. As thus described, according to the present embodiment, it was confirmed that an image quality being as high as the conventional method was maintained, as well as enabling an imaging with an expanded field of view. Similar results were shown in the other embodiment.

As for the imaging time, as shown in FIG. 25, where the imaging time of the sub FOV=40 cm in the table moving direction is assumed as 1, the imaging time 501 becomes longer as the sub FOV becomes narrower in the conventional moving table imaging. On the other hand, in the present embodiment, in response to the reduction of the sub FOV, the sliding phase encode number for the sub FOV is decreased. Therefore, there is no change in the imaging time 502.

In addition, as for the time for acquiring the device characteristics data, according to the method of the present invention, approximate device characteristics data can be acquired within relatively short time. In particular, when the device characteristics data is obtained simultaneously, there is no increase of total imaging time as a whole. Even though the device characteristics data is obtained in advance and it is additionally required to take out and put in the table with an additional imaging time, this imaging time is only a short period of time, since an image having a high resolution is not necessary for acquiring the device characteristics data. Specifically, a typical case is considered here in which one-thousand times signal acquisition is performed in the main scan. In order to obtain precise device characteristics data, it is necessary to measure the device characteristics data times equal to the signal acquisition times of the main scan. Therefore, the total imaging time is 1001 times longer than the main scan time. On the other hand, in the method to acquire the device characteristics data by the multi-station according to the present invention, the total imaging time is equal to or less than twice as longer. In the method to acquire the device characteristics data simultaneously, the total imaging time is one time longer, that is, the imaging time requires only the main scan time.

INDUSTRIAL APPLICABILITY

According to the present invention, it is possible to perform the continuously moving table imaging without extending the imaging time, even when the signal acquisition area is narrow in the table moving direction. Even in the case where the apparatus has an area available for the imaging, being narrow in the table moving direction, total body imaging at a high-speed is possible and this provides excellent usability.

BRIEF DESCRIPTION OF DRAWINGS

FIG. 1 includes illustrations showing an overview of the MRI apparatus to which the present invention is applied; (a) shows a horizontal magnetic field type apparatus, and (b) shows a vertical magnetic field type apparatus;

FIG. 13 illustrates a signal used in the image reconstruction in 3D imaging, and a processing result thereof;

FIG. 16 includes (a) and (b), each showing a relationship between the sliding phase encode and the table position in a modified example of the fifth embodiment;

DENOTATION OF REFERENCE NUMERALS

Figure 2:
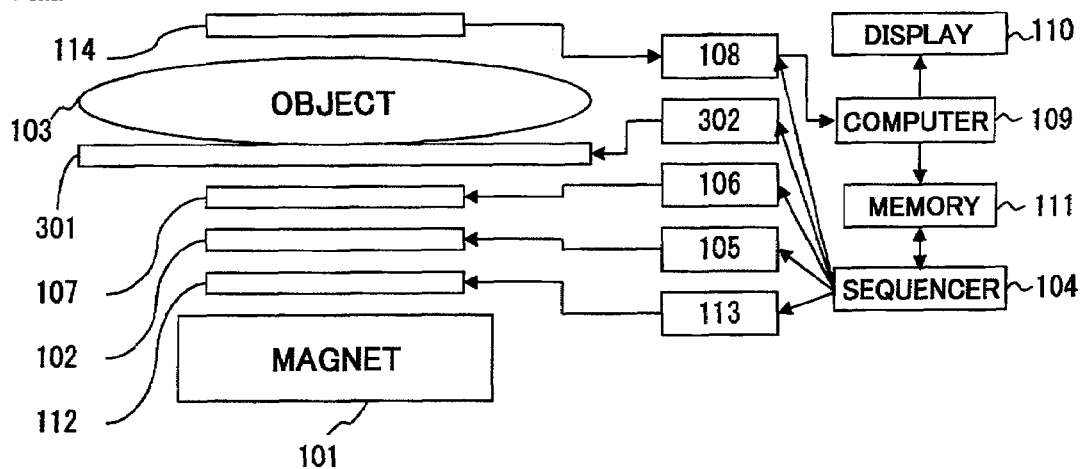
FIG. 2 is a diagram showing a configuration example of the MRI apparatus to which the present invention is applied.
Figure 3:
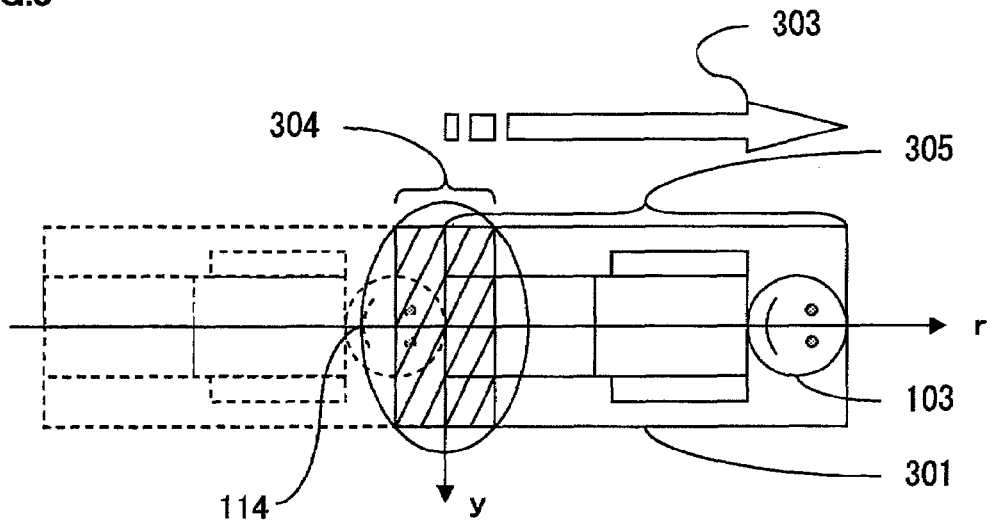
FIG. 3 is an illustration showing a relationship between a total FOV and a signal acquisition area of an examination target.
Figure 4:
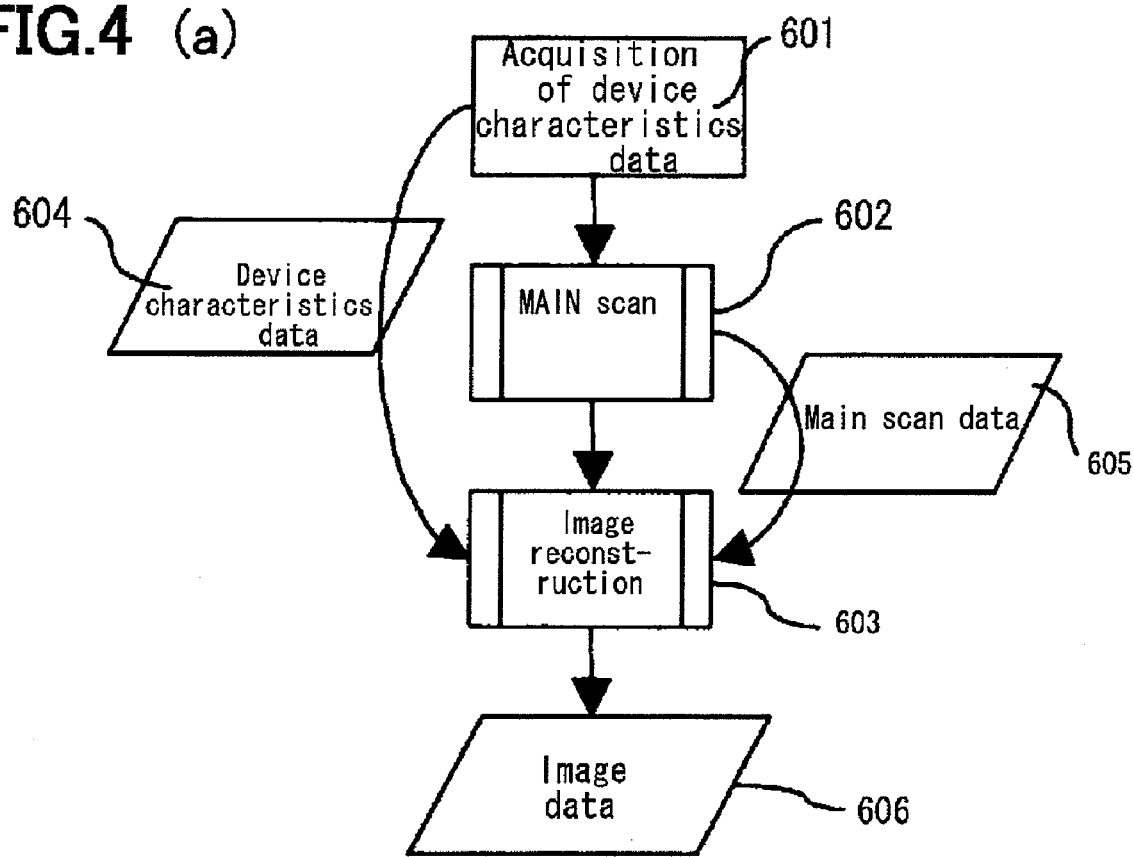
FIG. 4 illustrates a procedure of the continuously moving table imaging according to a first embodiment of the present invention.
Figure 4:
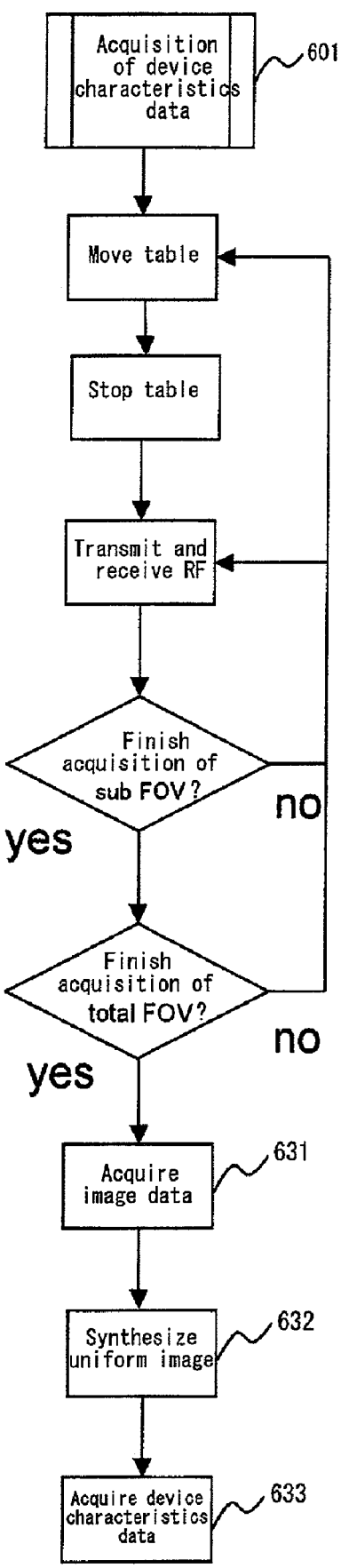
Figure 5:
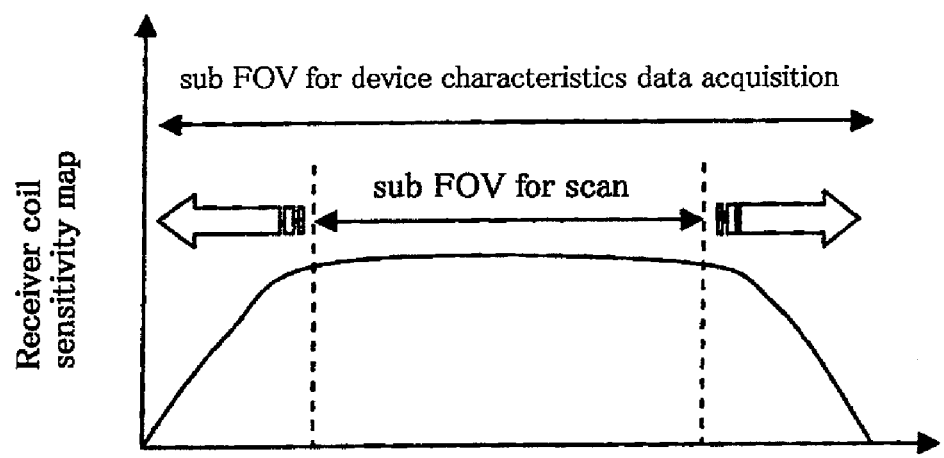
FIG. 5 is a chart showing a relationship between a sub FOV for acquiring device characteristics data, and a sub FOV for a main scan.
Figure 6:
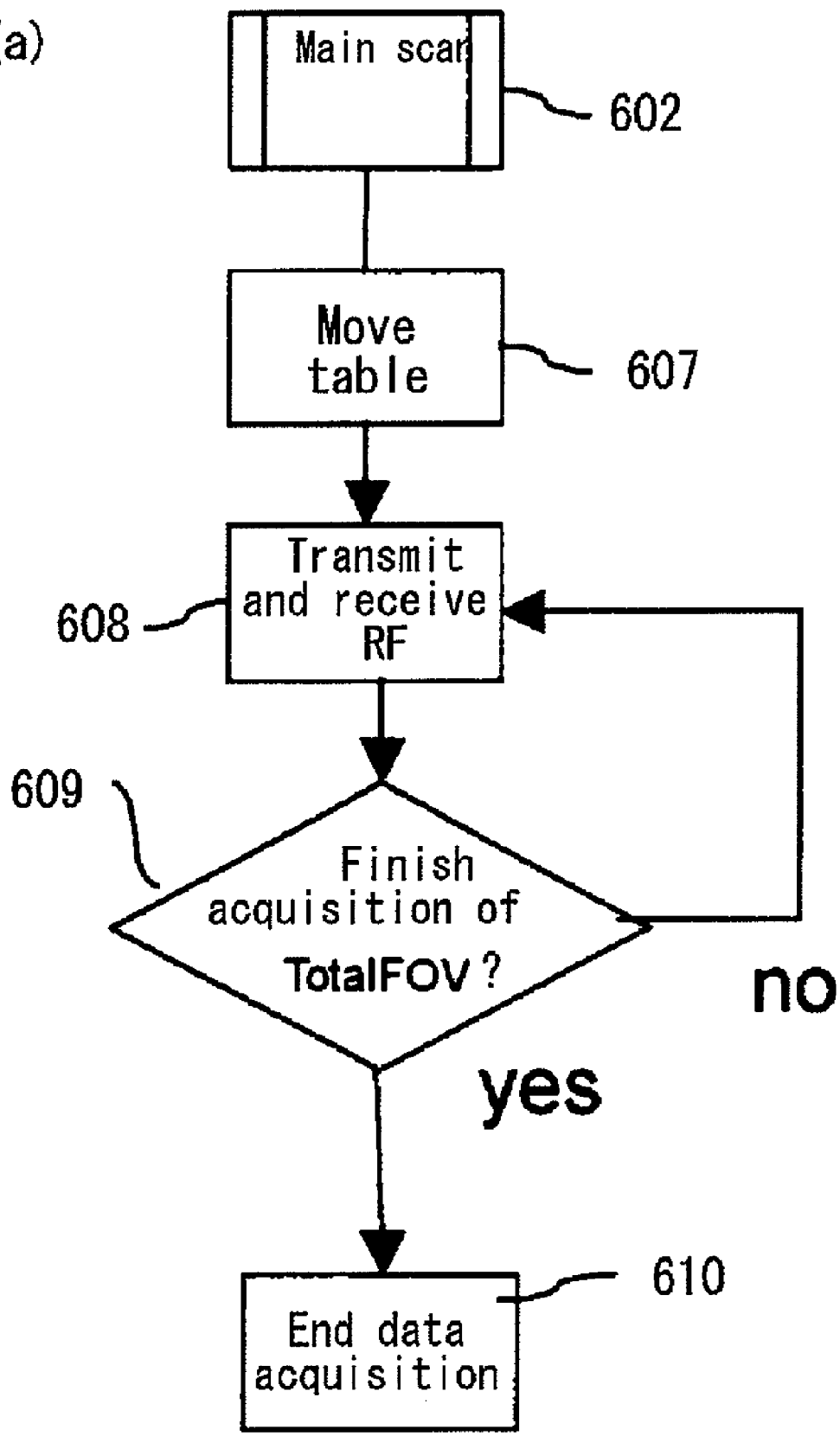
FIG. 6 illustrates procedures of the main scan according to the first embodiment.
Figure 6:
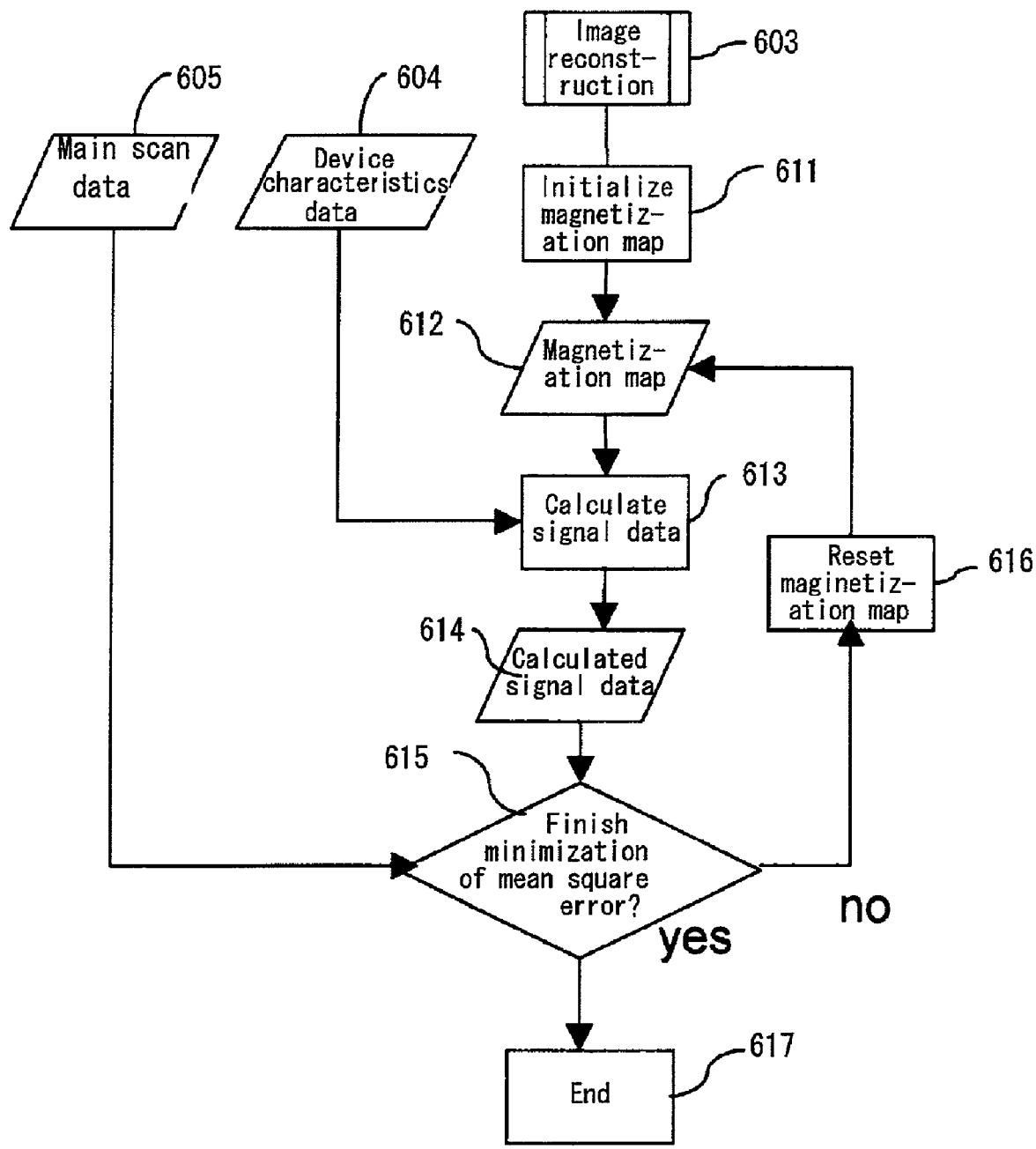
Figure 7:
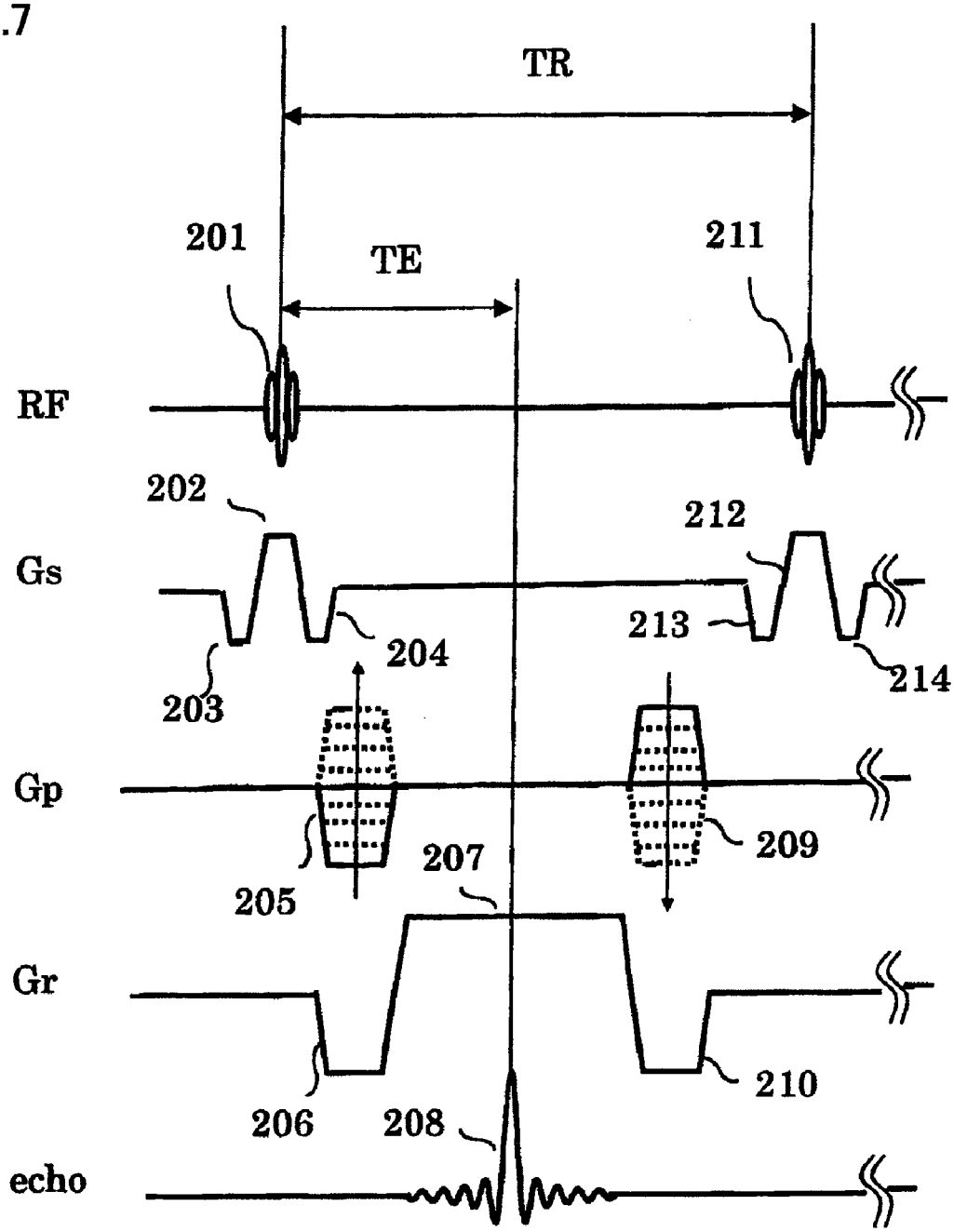
FIG. 7 illustrates one example of pulse sequence used in the continuously moving table imaging.
Figure 8:
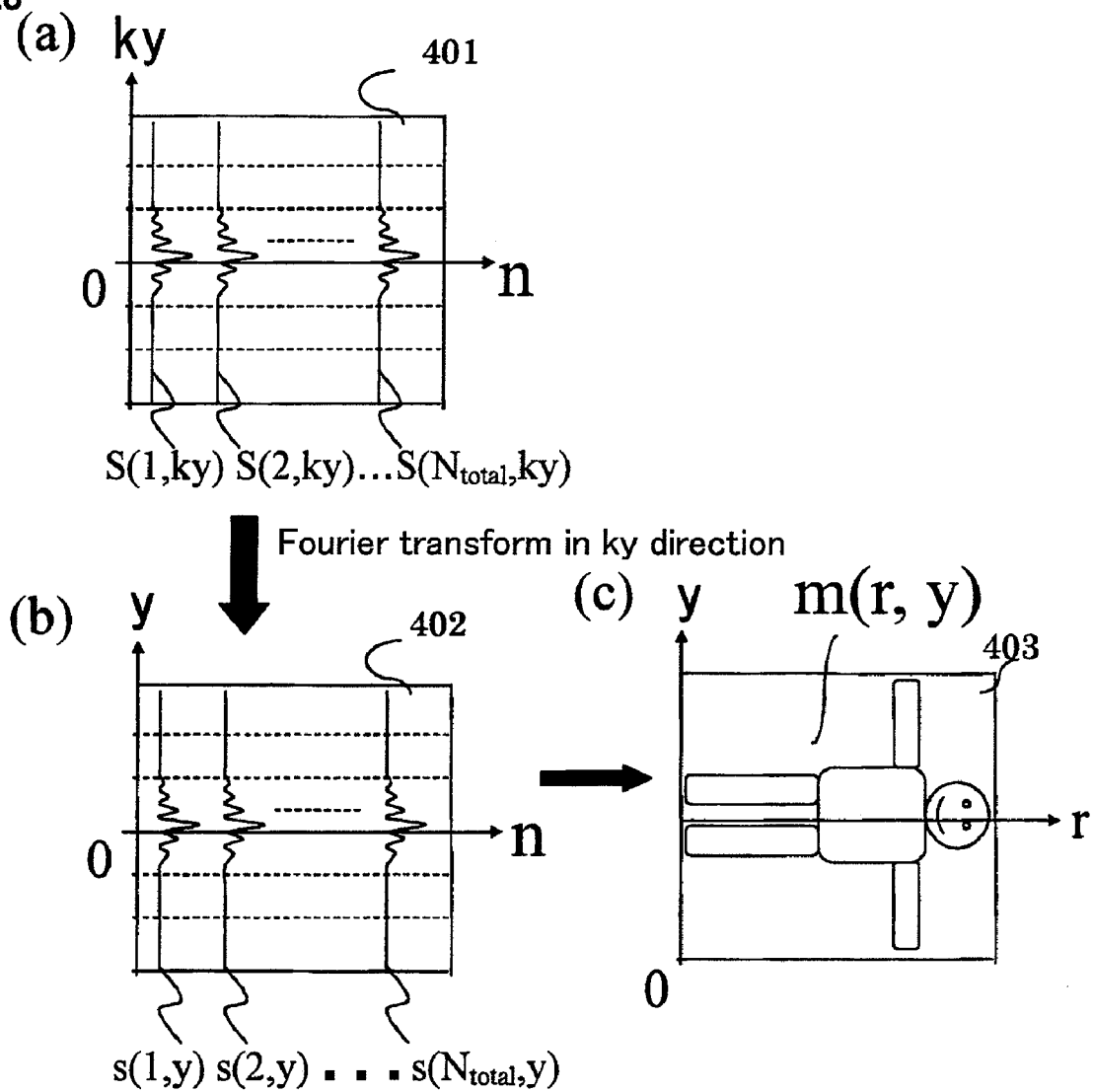
FIG. 8 illustrates a signal used in the image reconstruction in 2D imaging and a processing result thereof.
Figure 9:
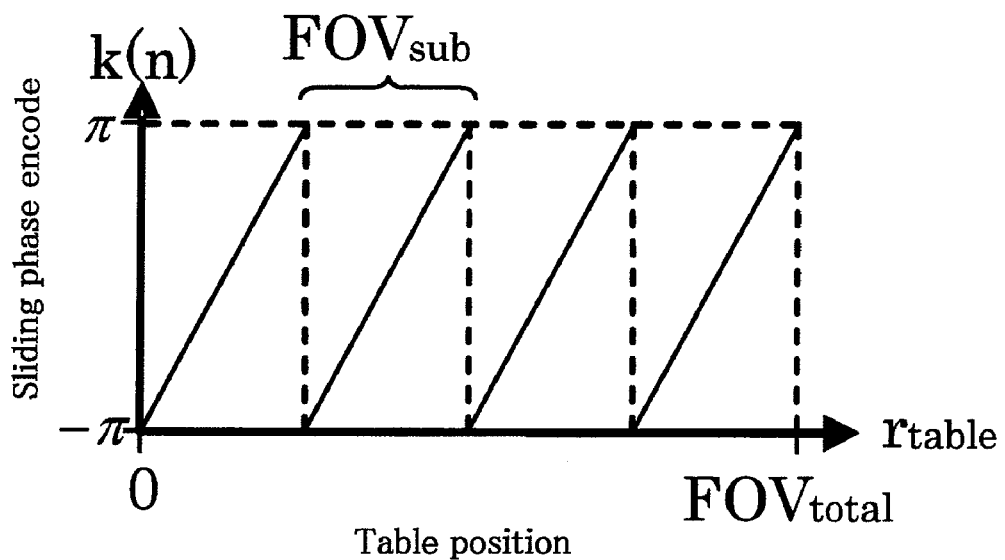
FIG. 9 illustrates a relationship between a table position and a sliding phase encode.
Figure 10:
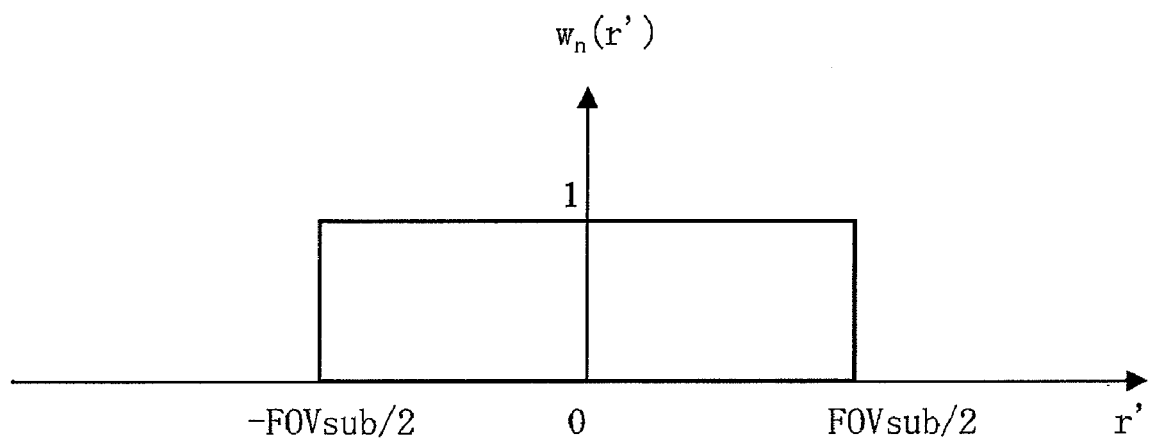
FIG. 10 illustrates device characteristics of the signal acquisition area.
Figure 11:
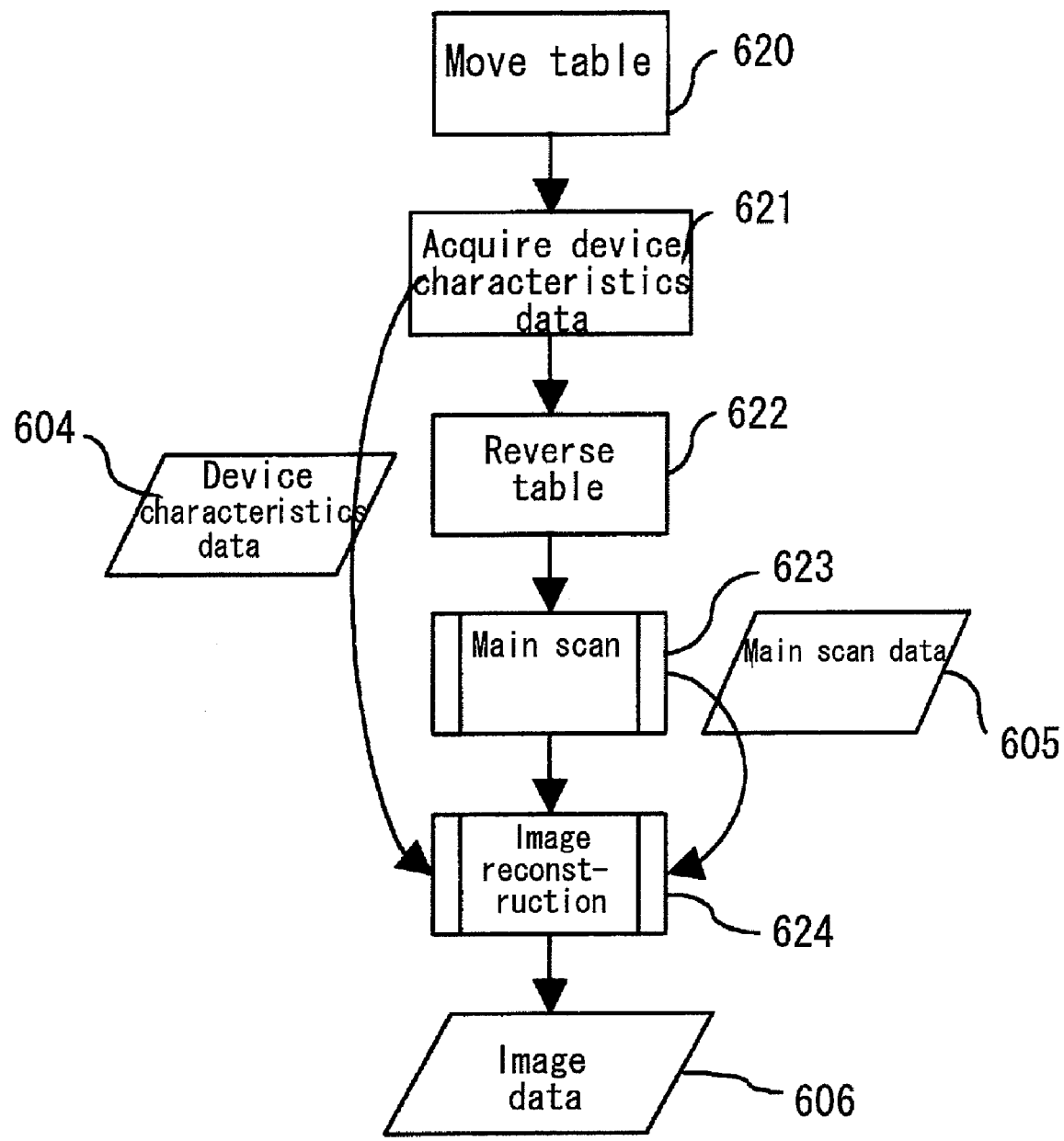
FIG. 11 illustrates another procedure of the continuously moving table imaging according to the MRI apparatus of the present invention.
Figure 12:
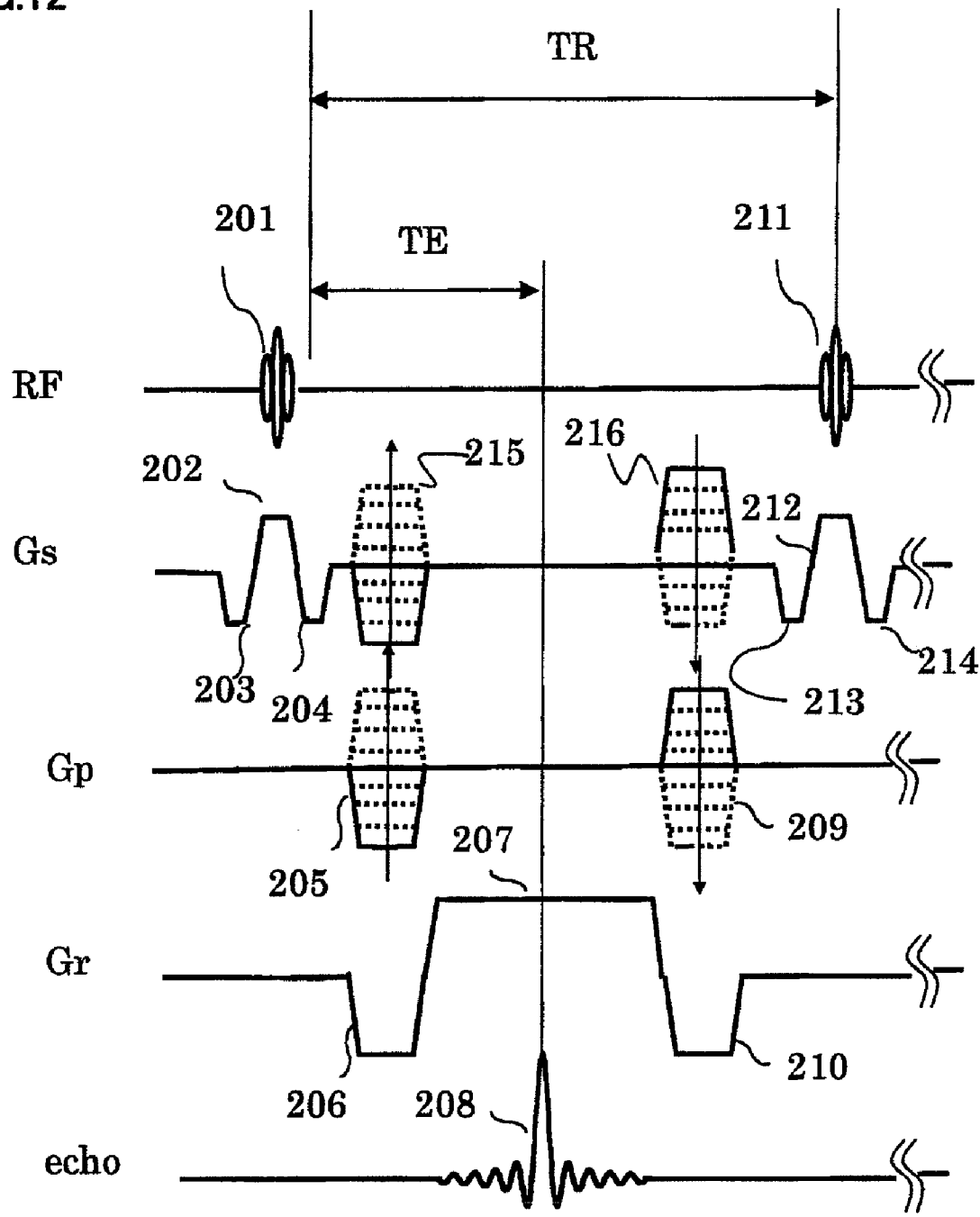
FIG. 12 illustrates another example of the pulse sequence used in the continuously moving table imaging.
Figure 14A:
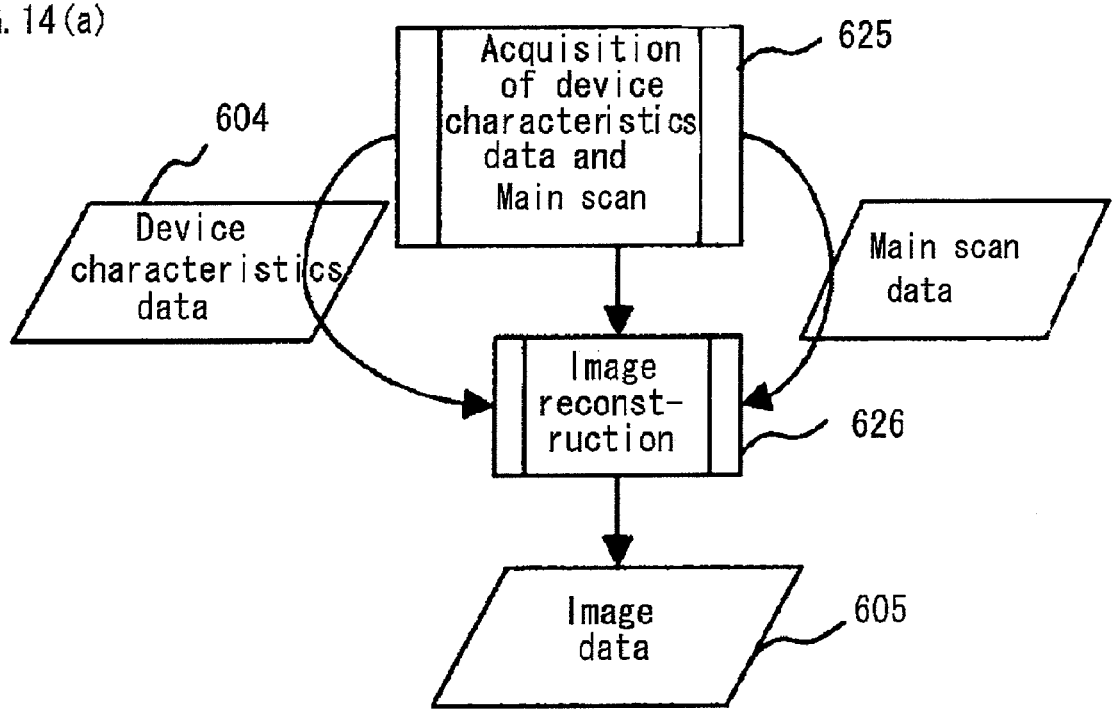
FIG. 14 illustrates one example of the procedure of the moving table imaging according to a fifth embodiment of the present invention.
Figure 14B:
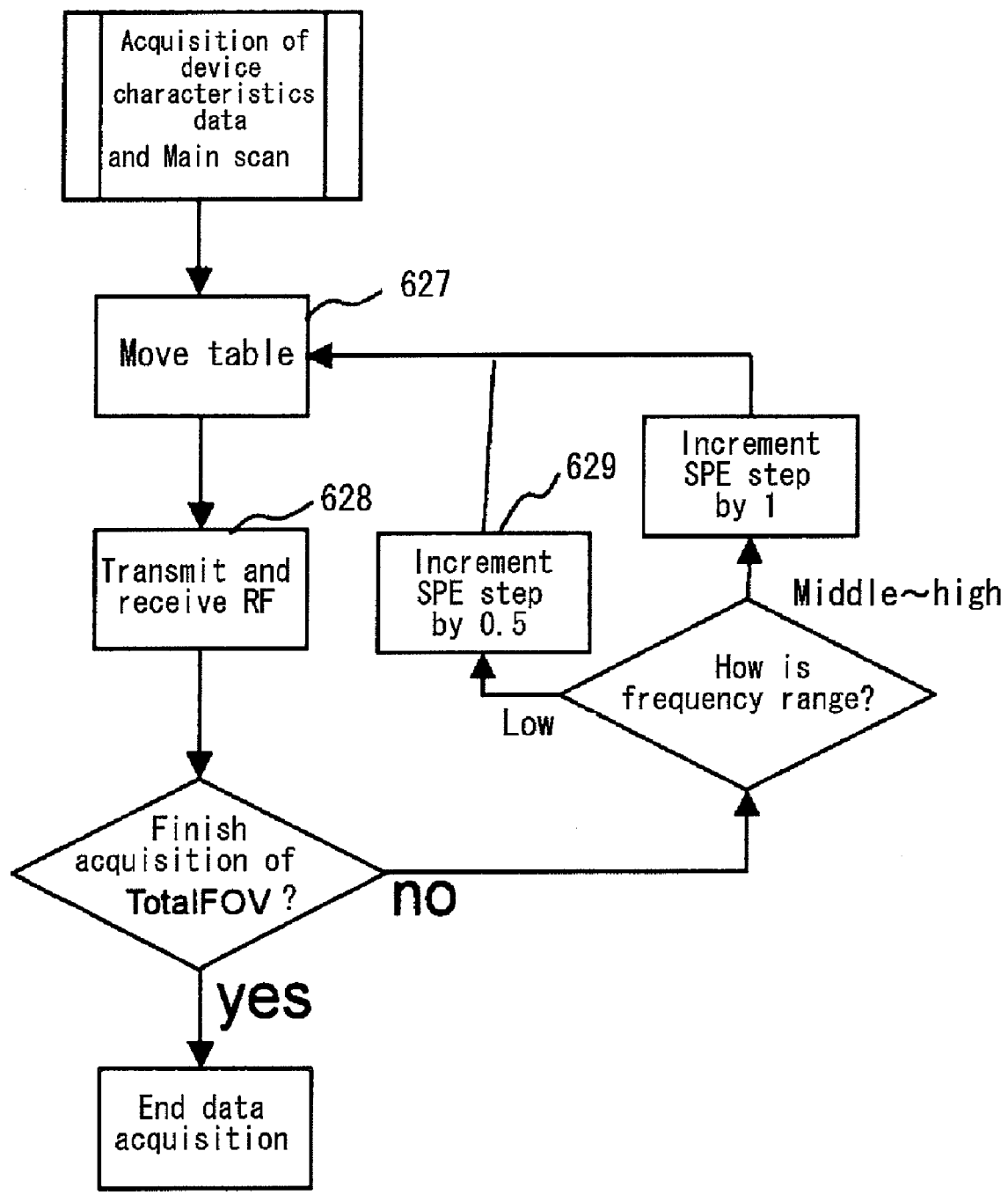
Figure 15:
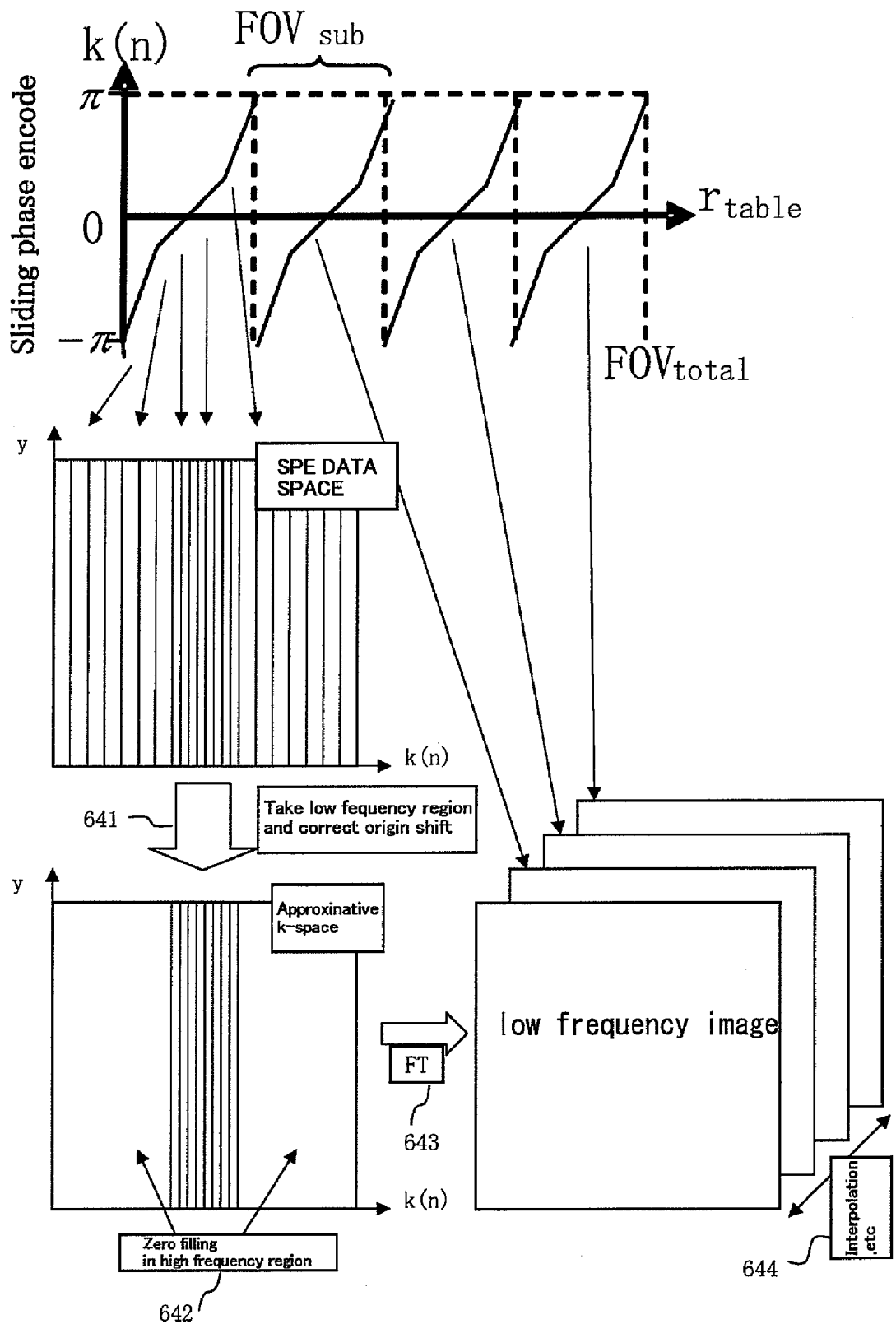
FIG. 15 illustrates a device characteristics data acquisition procedure according to the fifth embodiment of the present invention.
Figure 17:
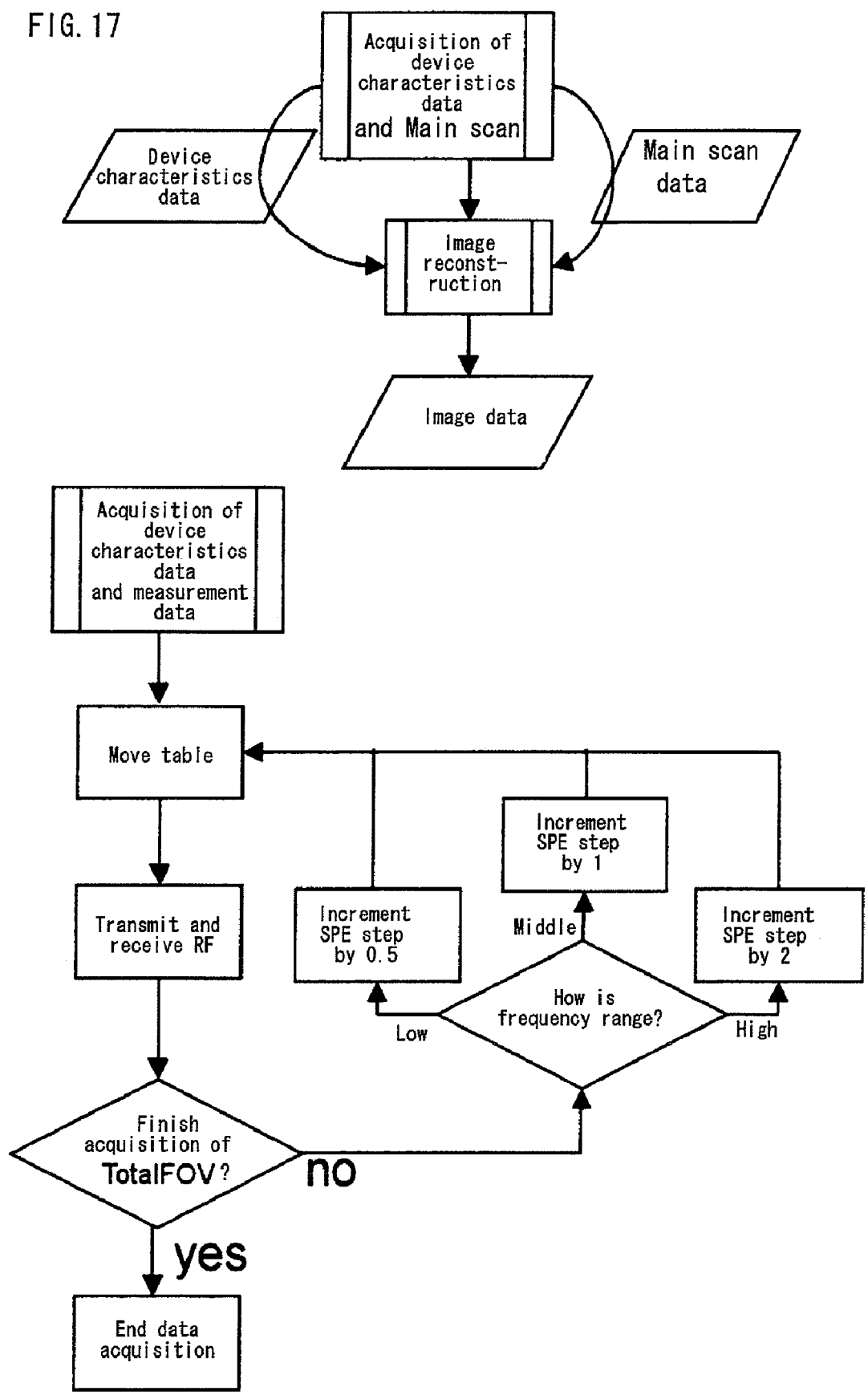
FIG. 17 illustrates a second example of the procedure of the fifth embodiment.
Figure 18:
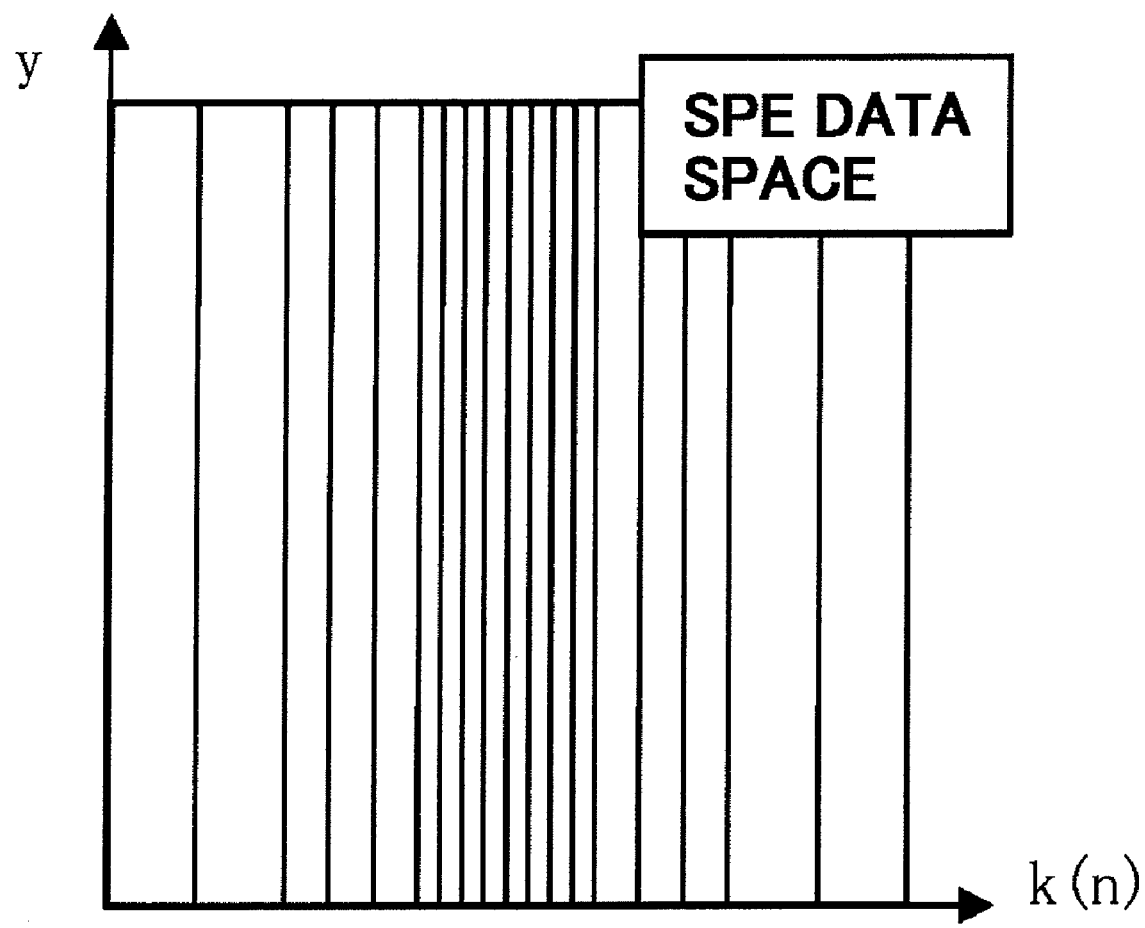
FIG. 18 illustrates SPE data obtained in the second example of the fifth embodiment.
Figure 19:
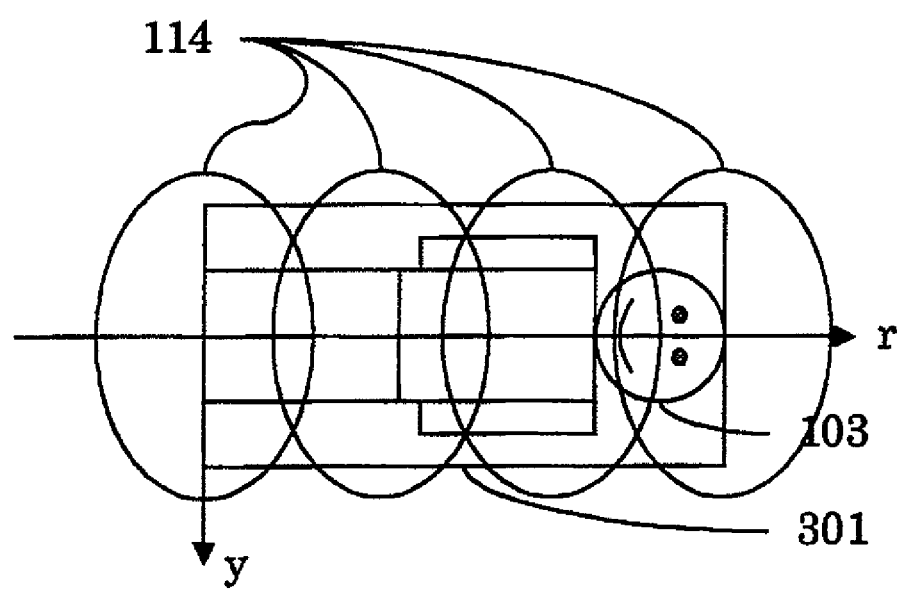
FIG. 19 illustrates a relationship between the examination target and a coil in the sixth and the seventh embodiments.
Figure 20:
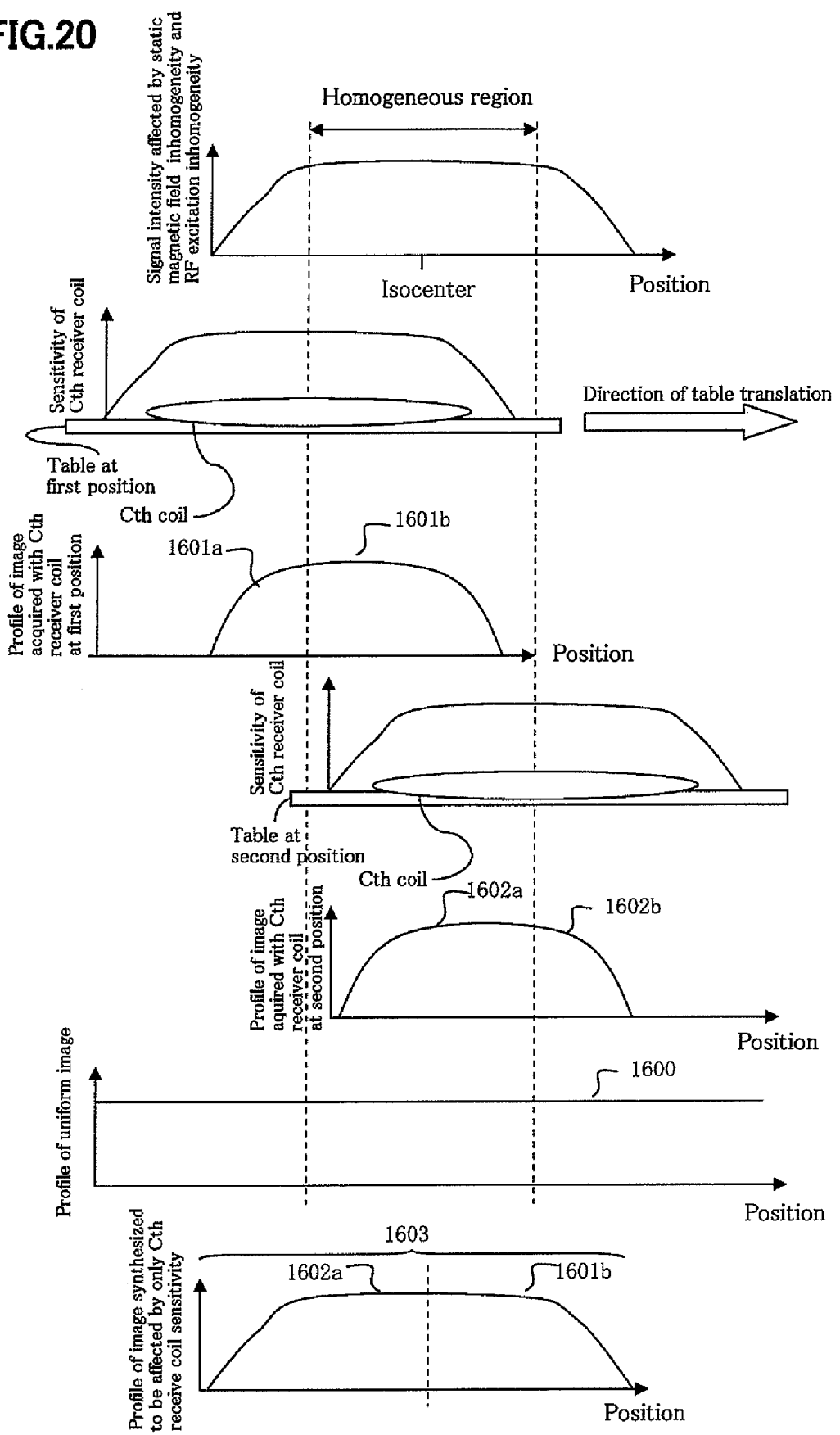
FIG. 20 illustrates a coil position in measuring the device characteristics in the sixth and the seventh embodiments.
Figure 21:
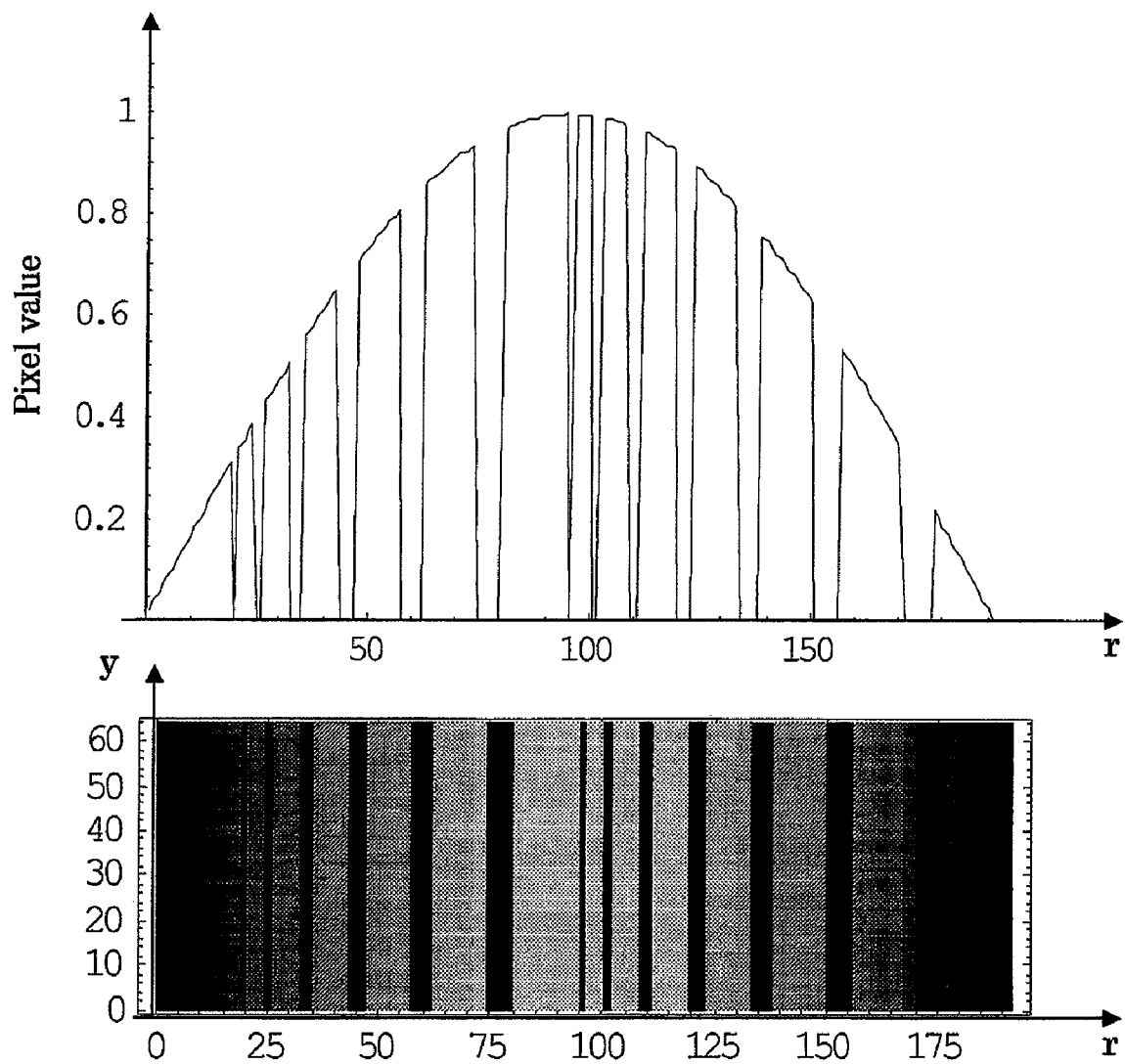
FIG. 21 illustrates the examination target.
Figure 22:
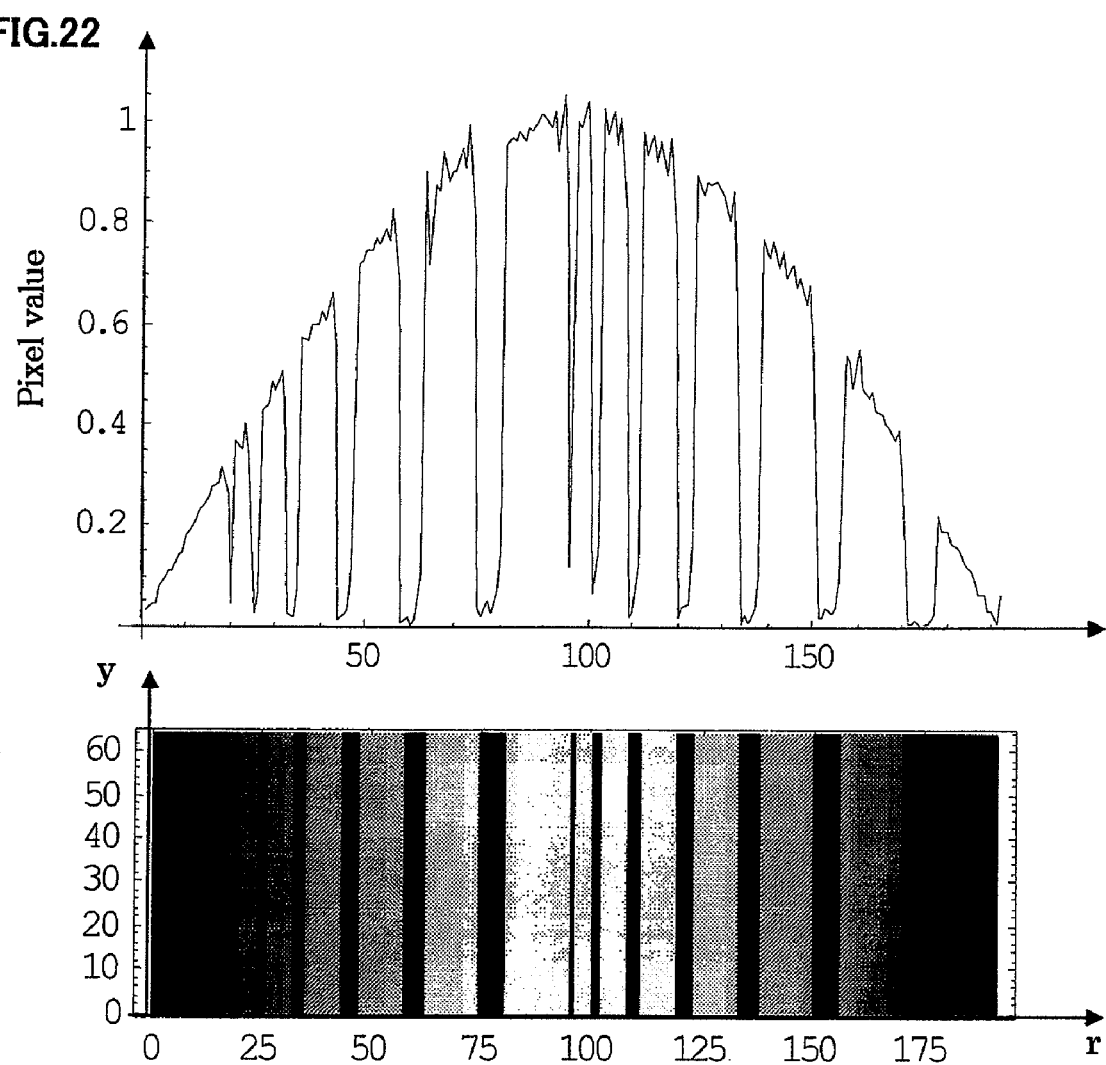
FIG. 22 illustrates a reconstructed image according to a conventional moving table imaging method.
Figure 23:
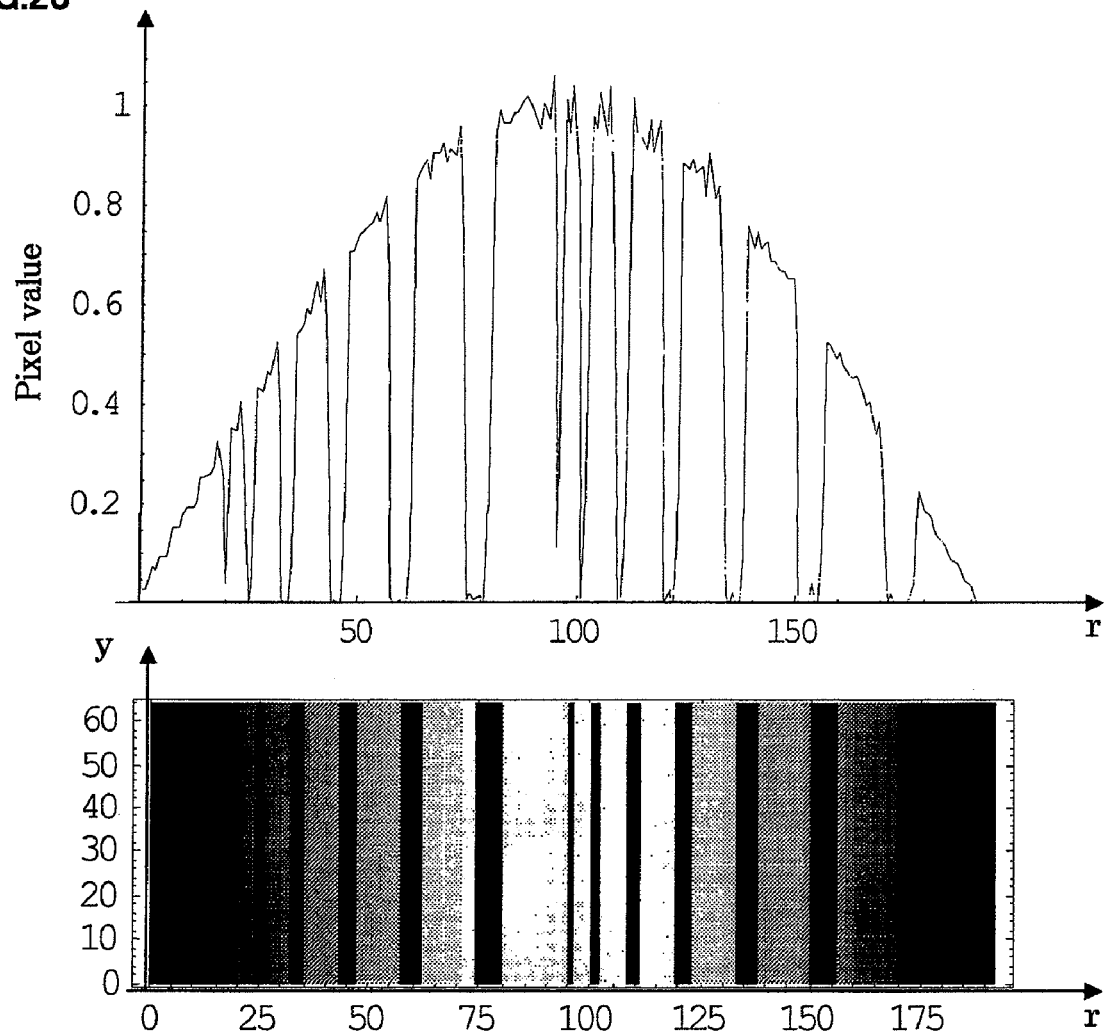
FIG. 23 illustrates a reconstructed image according to the first embodiment.
Figure 24:
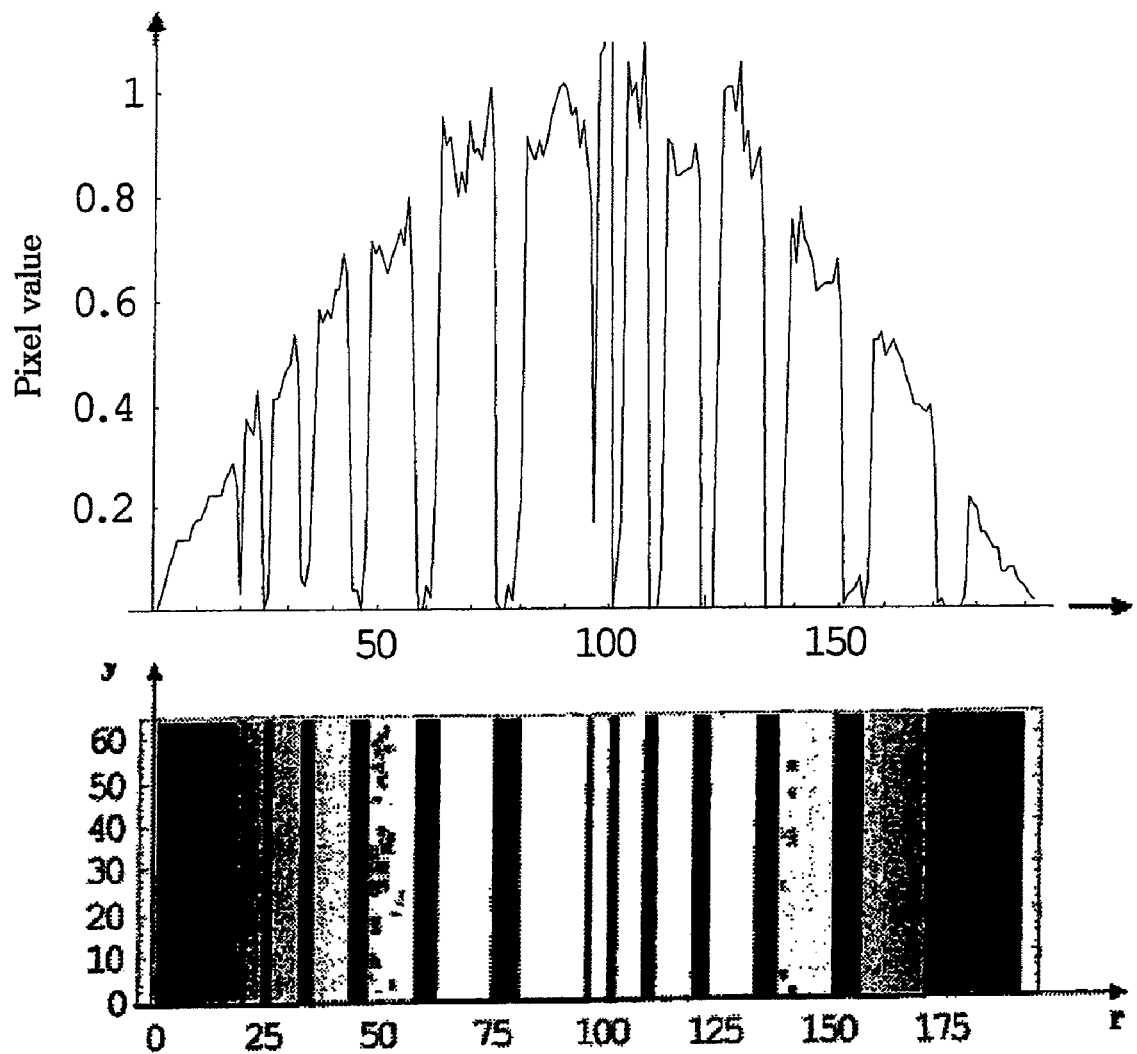
FIG. 24 illustrates a reconstructed image of the examination target shown in FIG. 21, according to the fifth embodiment.
Figure 25:
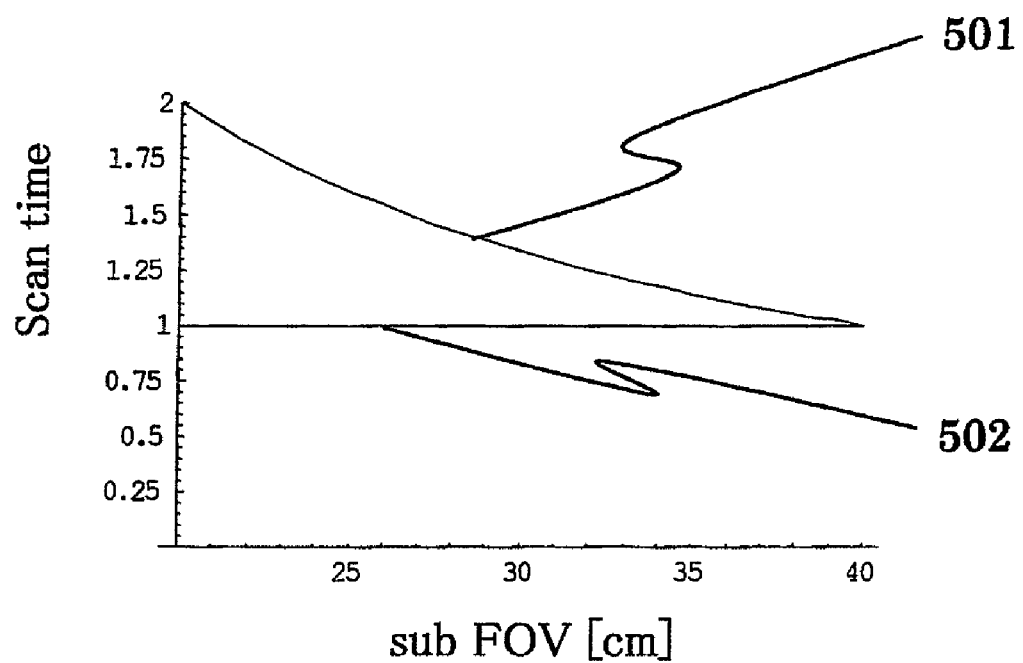
FIG. 25 illustrates a comparison of imaging time between the conventional method and the present invention.

101. MAGNET FOR GENERATING STATIC MAGNETIC FIELD, 102. GRADIENT MAGNETIC FIELD COIL, 103. EXAMINATION TARGET, 104. SEQUENCER, 105. GRADIENT MAGNETIC FIELD POWER SOURCE, 106. HIGH FREQUENCY MAGNETIC FIELD GENERATOR, 107. TRANSMISSION COIL, 108. RECEIVER, 109. COMPUTER, 110. DISPLAY, 111. MEMORY, 112. SHIM

COIL, 113. SHIM POWER SOURCE, 114. RECEIVING COIL, 301. TABLE, 302. TABLE CONTROLLER

What is claimed is:

1. A magnetic resonance imaging apparatus comprising,
a high frequency magnetic field generation means for generating a high frequency magnetic field to be applied on an examination target that is placed in an imaging space where a static magnetic field is generated,
a gradient magnetic field generation means for generating a gradient magnetic field to be applied on the examination target,
a transfer means being movable for mounting the examination target thereon,
a receiving means for receiving a magnetic resonance signal generated from the examination target,
an image reconstruction means for reconstructing an image of the examination target based on the magnetic resonance signal being received,
a control means for controlling operation of each means, and
a display means for displaying the image being reconstructed,
wherein,
the control means receives the magnetic resonance signal more than once, while the transfer means is moving, and controls the gradient magnetic field generation means and the receiving means in such a manner that an application amount of the gradient magnetic field in a moving direction of the transfer means is changed every receipt of the signal, and
the image reconstruction means determines a magnetization map of the examination target in a field of view wider than the imaging space, in such a manner that a sum of the square of an absolute value of a difference is minimized, the difference between the signal being received and a signal calculated from the magnetization map set as a variable.

2. The magnetic resonance imaging apparatus according to claim 1, wherein,
the image reconstruction means calculates the signal calculated from the magnetization map set as the variable, by using a position of the transfer means upon acquiring the signal, a relationship between the position of the transfer means and gradient magnetic field intensity in the moving direction, and device characteristics data.

3. The magnetic resonance imaging apparatus according to any one of claim 1 and claim 2, wherein,
the control means moves the transfer means at a constant speed when the magnetic resonance signal is received.

4. The magnetic resonance imaging apparatus according to any one of claim 1 and claim 2, wherein,
the control means reciprocates the transfer means, and acquires the device characteristics data required for reconstructing the image, when the transfer means goes either forward or backward.

5. The magnetic resonance imaging apparatus according to any one of claim 1 and claim 2, wherein,
the control means controls the gradient magnetic field generation means and the receiving means in such a manner that a phase encode gradient magnetic field in a direction different from the moving direction of the transfer means is applied, and receive the magnetic resonance signal.

6. The magnetic resonance imaging apparatus according to any one of claim 1 and claim 2, wherein,
a direction of the static magnetic field is in a vertical direction.

7. The magnetic resonance imaging apparatus according to any one of claim 1 and claim 2, wherein,
a direction of the static magnetic field is in a horizontal direction.

8. A magnetic resonance imaging apparatus comprising,
a high frequency magnetic field generation means for generating a high frequency magnetic field to be applied on an examination target that is placed in an imaging space where a static magnetic field is generated,
a gradient magnetic field generation means for generating a gradient magnetic field to be applied on the examination target,
a transfer means being movable for mounting the examination target thereon,
a receiving means for receiving a nuclear magnetic resonance signal generated from the examination target,
an image reconstruction means for reconstructing an image of the examination target based on the nuclear magnetic resonance signal being received,
a control means for controlling operation of each means, and
a display means for displaying the image being reconstructed,
wherein,
the control means controls the gradient magnetic field generation means and the receiving means in such a manner that a measurement of the nuclear magnetic resonance signal to obtain device characteristics data, as a device characteristics measurement, and a measurement of the nuclear magnetic resonance signal to obtain a magnetization map of the examination target, as a main scan, are conducted, and, in the main scan, the nuclear magnetic resonance signal is received more than once while the transfer means is moving and an application amount of the gradient magnetic field in a moving direction of the transfer means is changed every receiving of the signal, and
the image reconstruction means computes device characteristics by using the nuclear magnetic resonance signal measured in the device characteristics measurement, calculates a theoretical signal according to a presumptive magnetization map by using the device characteristics, and determines a magnetization map of the examination target in a field of view wider than the imaging space, in such a manner that a sum of the square of an absolute value of a difference between a signal measured in the main scan and the theoretical signal is minimized.

9. The magnetic resonance imaging apparatus according to claim 8, wherein,
the control means moves the transfer means to each multiple station and executes the device characteristics measurement in each station of the transfer means.

10. The magnetic resonance imaging apparatus according to claim 8, wherein,
the control means conducts the device characteristics measurement simultaneously with the main scan.

11. The magnetic resonance imaging apparatus according to claim 10, wherein,
the image reconstruction means uses a part of the nuclear magnetic resonance signal measured in the main scan, as the nuclear magnetic resonance signal to obtain the device characteristics.

12. The magnetic resonance imaging apparatus according to any one of claim 8 to claim 11, wherein,
the receiving means comprises a receiving coil fixed on the apparatus, and
the image reconstruction means uses a signal received by the receiving coil fixed on the apparatus to calculate the device characteristics at each position of the transfer means, where the nuclear magnetic resonance signal is measured in the main scan.

13. The magnetic resonance imaging apparatus according to any one of claim 8 to claim 11, wherein, the receiving means comprises a receiving coil fixed on the examination target, and the image reconstruction means uses a signal received by the receiving coil fixed on the examination target to calculate the device characteristics at each position of the transfer means, where the nuclear magnetic resonance signal is measured in the main scan.

* * * * *